United States Patent
McMeen et al.

(10) Patent No.: US 10,677,837 B2
(45) Date of Patent: Jun. 9, 2020

(54) SYSTEM AND METHOD FOR ELECTRICAL CIRCUIT MONITORING

(71) Applicant: Kyzen Corporation, Nashville, TN (US)

(72) Inventors: Mark Taylor McMeen, Huntsville, AL (US); Jason Edward Tynes, Huntsville, AL (US); Michael L. Bixenman, Old Hickory, TN (US); David T. Lober, Franklin, TN (US)

(73) Assignee: Kyzen Corporation, Nashville, TN (US)

( * ) Notice: Subject to any disclaimer, the term of this patent is extended or adjusted under 35 U.S.C. 154(b) by 0 days.

(21) Appl. No.: 15/170,710

(22) Filed: Jun. 1, 2016

(65) Prior Publication Data

US 2017/0350936 A1    Dec. 7, 2017

(51) Int. Cl.
*G01R 31/28*    (2006.01)
*G01D 21/00*    (2006.01)

(52) U.S. Cl.
CPC ......... *G01R 31/2817* (2013.01); *G01D 21/00* (2013.01)

(58) Field of Classification Search
CPC .......... G01R 31/2817; H01L 21/02172; H01L 2224/48137; H01L 29/1606; H01L 29/772; H04M 1/0277; G01N 27/02; A61B 5/0537
See application file for complete search history.

(56) References Cited

U.S. PATENT DOCUMENTS

| | | | | |
|---|---|---|---|---|
| 9,582,035 | B2* | 2/2017 | Connor | G06F 1/163 |
| 2003/0160623 | A1* | 8/2003 | Tanaka | G01N 17/02 324/719 |
| 2012/0084008 | A1* | 4/2012 | Zhan | E21B 41/00 702/6 |
| 2013/0092843 | A1* | 4/2013 | Turqueti | G01T 7/00 250/369 |
| 2014/0112510 | A1* | 4/2014 | Yang | H04R 1/021 381/332 |
| 2014/0331741 | A1* | 11/2014 | Shah | G01N 3/30 73/12.06 |
| 2014/0348707 | A1* | 11/2014 | King Smith | G01N 27/4148 422/82.03 |

(Continued)

FOREIGN PATENT DOCUMENTS

| CN | 2831113 Y | 10/2006 |
|---|---|---|
| CN | 102565878 A | 7/2012 |

(Continued)

OTHER PUBLICATIONS

PCT International Search Report and Written Opinion dated Aug. 10, 2017 for PCT/US2017/035239, 18 pages.

(Continued)

*Primary Examiner* — Akm Zakaria
(74) *Attorney, Agent, or Firm* — Regan L. Trumper; Herbert I. Cantor; Cochran Freund & Young LLC

(57) ABSTRACT

Disclosed is a system and method for monitoring a characteristic of an environment of an electronic device. The electronic device may include a printed circuit board and a component. A sensor is placed on the printed circuit board, and may be between the component and the board, and connects to a monitor, or detector. An end user device may be used to store, assess, display and understand the data received from the sensor through the monitor.

7 Claims, 16 Drawing Sheets

(56) References Cited

U.S. PATENT DOCUMENTS

2015/0164387 A1* 6/2015 Varsavsky ............ A61B 5/0537
702/182
2017/0176380 A1* 6/2017 Borini ................ G01N 27/4146

FOREIGN PATENT DOCUMENTS

| EP | 2677314 A2 | 12/2013 |
|----|------------|---------|
| EP | 2677314 A3 | 1/2014 |
| WO | 2015121534 | 8/2015 |

OTHER PUBLICATIONS

Extended European Search Report, Application No. 17807406.8-1010/3473065, for PCT/US2017/035239, for "System and Method for Electrical Circuit Monitoring", dated Mar. 10, 2020, 8 pages.
Written Opinion, Intellectual Property Office of Singapore, Application No. 11201810493W, for "System and Method for Electrical Circuit Monitoring", dated Mar. 23, 2020, 7 pages.

* cited by examiner

SYSTEM AND METHOD FOR ELECTRICAL CIRCUIT MONITORING

BACKGROUND

Electronics, including semiconductors and hard disk drives, require extremely high levels of performance. Even a minor lapse in quality or environmental conditions can result in severe operating variances. Environment conditions within which electronics operate, and are manufactured, can vary widely. Reliable measurements and data to properly utilize tools, such as electronic equipment, may be critical for certain fields, such as medical fields.

BRIEF SUMMARY OF THE INVENTION

An embodiment of the invention may therefore comprise a system for monitoring a characteristic of an environment of an electronic device comprising a printed circuit board and at least one component, the system comprising a sensor coupled to one of the component and the printed circuit board, wherein the sensor provides a response to at least one element in the environment, a detector connected to the sensor, wherein the detector comprises a device enabled to monitor data from the sensor.

An embodiment of the invention may further comprise a method of monitoring a characteristic of an environment of an electronic device comprising a printed circuit board and at least one component, the method comprising placing a sensor on the printed circuit board, connecting a detector to the sensor, and connecting the detector to an end user device.

DETAILED DESCRIPTION OF THE INVENTION

Figure 1:
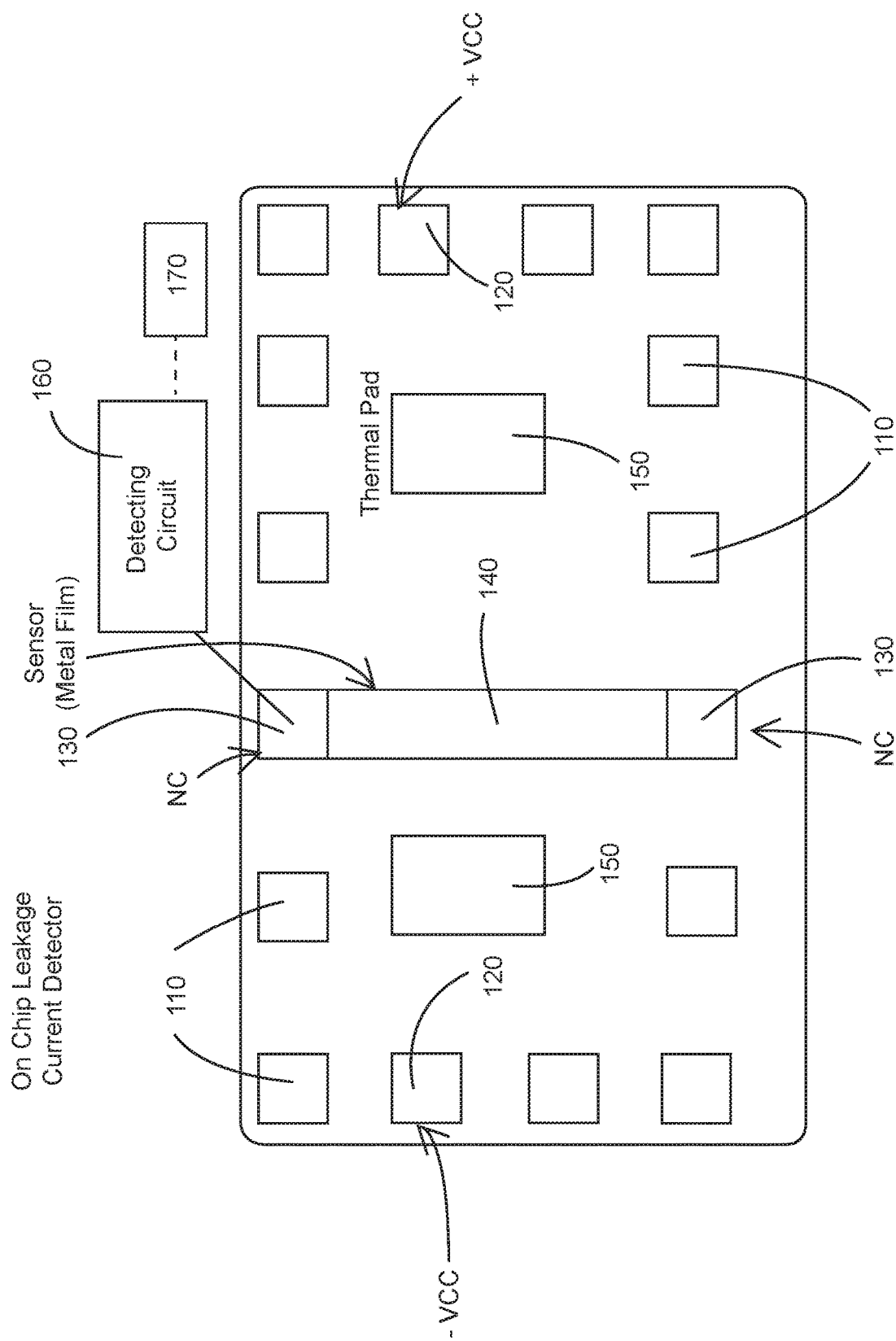
FIG. 1 shows an on circuit monitor from the underside view of a chip.

Monitoring of electronic circuit assemblies may prevent untimely failure. Embodiments of the invention comprise a method and apparatus for monitoring, in real time, changes in electrical characteristics which may be due to contamination of a circuit assembly either during production, which may lead to failure. This monitoring may also be performed when the circuit is in an end use environment, such as when the circuit is in the field. A field environment may be any environment, such as an outdoor environment, an indoor environment, or an environment that is internal, such as internal to a human body. In an example where the circuit is used internally to a human body, the invention may be an electronic health monitor that monitors potentially critical circuits and hardware for contamination that may lead to failure conditions. The monitoring may result in user alerts, or alerts to operators or service technicians. As a result of the alert, corrective actions may be performed by such technicians, or by doctors in the case of an electronic health monitor.

While real time monitoring and evaluation of effects on components is contemplated, it is also contemplated that a monitor or detector, or an end use device, as explained below, date/time stamp data from a sensor in order that changes in the environment or characteristics related to the environment be correlated to events.

Embodiments of the invention provide monitoring of integrated circuits, and other electronics, comprising sensors, computational devices, and ancillary supporting electronics. Characteristics of electronics are monitored, for example, in real time and may be used to inform decision making elements regarding any related risks and any related reliability as the monitoring may relate to possible failure modes. Other modes related to reliability, such as modes where performance is impacted or other measurements are influenced but where failure is not necessarily resultant may be impacted. For instance, it may be chemical contamination that causes the degradation or failure.

While there are many non-electrochemical failure modes, electrochemical modes, for purposes of this embodiment, are defined modes caused by the impact of any chemical or other contaminant, on an electrical circuit. The effects of such contamination may be measured through sensing changes in electrical characteristics of a device such as an integrated circuit. In order to achieve high reliability, the device in question should be clean from contaminates that would negatively impact the device, such as ionic contamination or contamination that would induce corrosion or undesirable electrochemical reactions. Cleanliness in this context may be defined as the absence of contamination on a circuit board. Contaminations may be under components on the board and may cause failure or degradation of the device. In particular, cleanliness is the lack of ionic species or electrochemically active species on the board. It is understood that cleanliness is not limited to any particular source, or chemical identity. Rather, contaminations, or physical imperfections, relate to those that impact the circuit with particular focus on the electrical impact, such as leakage current, dielectric losses, parasitic capacitance, and by electrochemical impacts, such as galvanic corrosion, dendritic growth, and electrochemical migration. Embodiments of this invention may provide an on board, or on component sensor or device or system, enabled to gather data and manipulate that data into a decision point. The ability to gather data on the reliability of a device or a subsystem of the device may result in less downtime or in life saving decisions or actions. Embodiments of this invention provide a device and system capable of monitoring the electronic assets for electrical performance against changes in its working environment, specifically on board cleanliness or physical integrity, and the changes over time on the board and under components.

The location of contaminations may also be important, as well as the type of contamination. Residue pooled under a component may still be active and ionic in nature. Pockets of contamination may be influenced by flux type, placement, wash characteristics, solder paste volume, PCB cleanliness and component type contamination. Accordingly, it can be seen that cleanliness and contamination is a "multi-variable" issue.

There may also be a wide variety of contamination sources. Contamination sources may include fabrication residues on components, plating salts and uncured solder mask on PCBs, flux residues, material handling from human induced solvents, body oils and organic matter, processing equipment, cleaning machine effectiveness, unique non-standard processes and materials, touch up and rework operations. There may also be other contamination sources or causes not listed. The embodiments of the invention are not limited to any particular contamination or cause, or list of contaminations or causes. Those skilled in the art will understand the wide variety of contaminations and causes as well as that there may be other, unknown, contaminations or causes. Any and all contaminations or causes may cause problems or degradations due to intermittent connections, corrosion, electrical shorts or arcing, for example. These effects can negatively impact device functionality and end user requirements. In certain instances, these effects may compromise national security or place people's lives at risk. Even on products that are not life critical or related to national security, uninterrupted service is often not tolerated by end users. Business may be lost when products do not provide long term reliability.

As noted above, contamination on electronics, such as Printed Circuit Boards (PCB) is a concern for the reliability of the entire assembly or product that contains the electronics. While many consumer electronics applications may not be concerned with the reliability of electronics, particularly long term reliability, there are many industries, such as the military, medical, capital equipment, aerospace, industrial, and oil exploration industries, for example, where failure of electronics is considered unacceptable, and extremely costly. This is primarily due to the risk of loss of life incidents, or an expensive or lengthy period of inoperability of the equipment leading to a large unexpected cost, or in aerospace applications, such as satellites repairing faulty electronics is not an option. Further, knowledge of contamination on electronics can allow a manufacturer of the electronics, or the seller of the items, to make business decisions based on projected life expectancy of the product.

There may be many sensors that can be used to gather data on different contaminates or changes in electrical parameters. Examples of sensors that may be used with the invention, either on the board or on the circuit, include electrical characteristic sensors (resistance, current, voltage, impedance, reactance, dielectric constant and radio frequency characteristic sensors), environmental/meteorological sensors (temperature, atmospheric pressure, humidity, light, air flow, condensation sensors), chemical sensors (ion selective electrodes, potentiostatic, electrochemical cells, voltammetry, chemical selective field effect transistors, electrochemical sensors), gas sensors, and physical sensors (stress, strain, pressure sensors).

Resistance sensors may be either on board or on circuit and allow for measurement of resistance between two electrodes. Depending on the resistance measured, the presence of contaminants can be assessed either underneath the components or on the board surface.

Capacitive sensors may be on board or on the circuit and allow for measurement of the capacitance between two electrodes. Depending on the capacitance measured, the presence of contamination underneath components or on the board surface can be assessed. For instance, in many component types and circuit types, capacitance must be relatively low for proper functioning. Measurements of capacitance beyond a certain threshold may indicate the presence of contaminants.

Impedance sensors may be on board or on the circuit and may provide indications of a combination of resistance and capacitance. Incorporation of the frequency domain may provide a more detailed assessment of the presence of contaminants on the circuit board or underneath a component. This may be useful, for example, in the context of high speed electronics and radio frequency electronics.

Voltage sensors may be on board or on the circuit and allow for the measurement of voltage leakage between electrodes. Depending on the voltage leakage found, the presence of contaminants may be assessed underneath components or on the board.

Current sensors may be on board or on the circuit and allow for the measurement of temperature using a thermistor or other type of temperature sensor between electrodes. The temperature determined on the board or under a component may aid in determining the lifespan of semiconductors such as diodes, transistors, and more complicated integrated circuits (IC). Monitoring for changes underneath a component allows for the analysis of IC aging as a function of temperature changes overtime.

Humidity sensors may be on board or on the circuit and allow for the measurement of humidity measured by the electrodes. Humidity sensing may aid in assessing moisture absorption possibilities as that may relate to activation and movement of ions underneath a device or on the board.

Chemical sensors may be on board or on the circuit and may allow for one or more chemical type sensors. Chemical sensors allow for highly selective monitoring of chemical species, such as an immunoassay, or a non-selective technique such as an Oxidation Reduction Potential (ORP) electrode, which responds to many different electrochemically active species. Some chemical sensors may be able to be: miniaturized so that they may be placed underneath components, use no reagents and thus eliminate maintenance, are solid state or use gel materials to avoid contamination of a circuit, or may output a signal that is easily converted into an electronic signal. Chemical sensors include, but are not limited to, ion select electrodes (ISE) including pH electrodes, coulometry, potentiometric, voltammetry, amperometry, and chemical selective field effect transistors. The specific environment that a device resides in may determine what particular chemical sensor types are used for the monitoring and what chemical species are monitored. For instance, if the electronics to be monitored are in a fluid environment where certain pH levels may cause excessive corrosion to the device, the pH electrode may be used and would signal that there are potential issues with the monitored device. The electronic assembly would detect changes in the local environment and the changes can be correlated to the reliability of the electronic device. The correlation may be recorded as accumulated damage to the device and use an actuarial type table to determine a projected lifetime, for example.

Gas sensors may be on board or on the circuit and allow detection of the influx of gases underneath components that may either directly degrade an assembly or may allow electrochemical reactions to occur which may lead to further degradation or failure. Examples of such gases are acidic, basic, sulfurous, or corrosive.

Radiation sensors may be on board or on the circuit and allow for the measurement of radiation. Such radiation may be alpha, beta, gamma or X-ray radiation. Depending on the amount of radioactive measurements found, assessment can be made of the impact of the radiation. Alternatively to distributing discrete sensors on the circuit assembly, radiation sensors may be placed underneath specific components that are radiation sensitive, such as the memory and the microprocessor. This will allow a determination of radiation exposure to particular components.

Physical sensors may be on board or on the circuit and allow for the measurement of physical stresses such as stress, strain, and pressure at a specific component. Physical sensing provides reliability assessment for electronics due to its ability to discern changes in stress or strain on components. Physical sensing allows for an assessment of physical damage, abuse, changes in temperature, or even electrochemical processes that result in a change in operating conditions relating to degradation or failure.

Sensors may be on board or on a component or under a component and may be wired or wireless depending on the desired use. The diversity of how and where a sensor is used allows for a number of different applications and environmental contexts.

Sensors may provide raw data streams that are manipulable into useful data through a variety of different electronic, or otherwise, devices. Such devices include, but are not limited to microprocessors, analog-to-digital converters and other well know devices known to those skilled in the art.

In embodiments of the invention, electrically conductive traces that serve as sensors may preferably be located under or on components. The traces may be connected to a monitoring circuit. The monitoring circuit may then be used to alert operators, or system features, of potential device functional degradation or failure.

Embodiments of the invention may use conductive material, or traces, as a sensor and circuitry to monitor certain electrical characteristics of key areas of the electronic assembly. As noted above, the electrical characteristics that may be monitored include, but are not limited to: electrical resistance, capacitance, inductance, voltage, current, dielectric constant, and/or temperature. Temperature, while a meteorological concept, is listed as an electrical characteristic due to the fact that it may be measured electrically, such as by using a thermistor. Those skilled in the art will recognize that a thermistor may change resistance based on temperature. A thermocouple may also measure temperature by monitoring voltage changes. It is understood that temperature is a useful predictor in regard to the life time of transistors, diodes, IC and other electrical components that may be used on a circuit board.

All of the sensors mentioned above, as well as others, may be used for data acquisition from sensor to microprocessor or computational system and then to and end device. Combinations of different type sensors may also be used.

Sensors typically require some sort of power source. Energy sources may be on board such as power or ground planes or it may be a battery based source. Energy harvesting techniques such photovoltaic or thermoelectric energy harvesting techniques may be used. Others techniques known to those skilled in the art may also be used.

In embodiments of the invention, the monitoring may be done continuously or periodically depending on the context of the monitored device and user operable options, or design options.

In embodiments of the invention, the traces may be constructed of any electrically conductive material. Those skilled in the art will understand common materials used in electronics manufacturing process. These materials may include, for example, copper, silver, gold, nickel, aluminum, palladium or alloys of metals. Other conductive materials may also be used. Depending on the expected environment for the product incorporating an embodiment of the invention, different of the conducting metals may be preferred. Metals or alloys resistive to corrosion may be preferred to copper's lower price point and ready availability in corrosive environments, for example. As those skilled in the art will understand, copper is subject to rapid corrosion in the presence of chloride ions, but gold is not. In such an environment, gold would be preferred so that the traces do not undergo the same corrosive effect as the device being monitored. Corrosion of a trace material may alter the electrical characteristics in the same way that the product being sensed is altered. Those skilled in the art will understand the preferred materials for intended atmospheres.

As is understood from this description of the preferred embodiments, no limitation on the ways in which the conductive traces in intended. As noted, the embodiments of the invention may be either on the circuit board or on the circuit. Traces employed by embodiments of this invention need not have any specific shape or be located in any particular place. It is understood, however, that the traces should not be located in a location that negatively impacts the desired operation of the device being monitored.

As is understood from this description of the embodiments, no limitation on the connection of the sensor traces to a monitoring circuit is intended. Both on board and on circuit implementation of the invention contemplate that the implementation is underneath components, either on the underside of the component itself or on the circuit board under the component. An example of connections between the traces and the monitor are electrical connections such as leads, solder bumps, and pads on the component. Those skilled in the art will understand the various methods of electrically connecting different things. For instance, one method of making the connections on an integrated circuit is to use otherwise unused connections between the component and the circuit board. Those skilled in the art will understand that various component packages, such as Dual Inline Packages (DIP), Small Outline IC packages (SOIC), Ball Grid Arrays (BGA) packages, Land Grid Array (LGA) packages, flip chips, and other packaging technologies will have more connections (e.g. leads, wire bonds, pads, balls, solder joints) to the circuit board than the devices requires. Typically, these connections are usually soldered but are electrically disconnected from the device within the component and the pad on the circuit board. These non-connected connections, or floating connections, may be used by embodiments of the invention without impacting the component function. For instance, in the on circuit method of the invention, the sensor traces can be conveniently connected to these connections on the device and then the corresponding connection on the circuit board may be connected to the monitoring circuit. In the on board embodiment of the invention, these pads may serve as useful connection points.

In embodiments of the invention, the unused connections may be designed by a component manufacturer to connect to a monitoring device of the invention. Such an implementation may contemplate that the microprocessor on the board may contain the monitoring circuit. Such an embodiment would keep the sensors and monitoring circuitry entirely on the component, as opposed to using an unmodified component where traces have to connect down to the board and to additional circuitry.

Monitoring circuitry pursuant to embodiments of the invention and with understanding of what is disclosed here can be designed by one of ordinary skill in the art based on what electrical characteristics are desired. It is understood that the measurements may be passive. A passive monitoring would be with no voltage or current applied to the sensor traces. Such passive monitoring may be accomplished, for example, in a temperature measurement with a thermocouple arrangement of conductors. In non-passive embodiments, for example, a small voltage, such as 3.3 volts, may be applied to a pair of sensor traces and then the current measured between them. It is understood that these are examples of implementations and the monitoring circuitry is not thereby limited.

Sensors utilized by embodiments of the invention may be fabricated by any technique understood by those skilled in the art. Some examples of techniques for making the traces are electrolysis deposition, electroplating, conductive inks or polymers, wires, foils, lithography and photolithography.

The underside of electrical components on a board is not readily measurable. Providing traces on the underside of such components allows for such measurement. For instance, photo-reactive inorganic salts, in addition to one or more of the methods mentioned above, may be deposited in a pattern on the underside of the circuit. The deposited metals may be electroplated or added by any of a number of processes. An example of a deposition process is that of U.S. Pat. No. 8,784,952, which is embodied herein for all it teaches and discloses.

As noted above, embodiments of this invention monitor the resistance in traces underneath components. When contamination is present, the resistance between traces may decrease to indicate ions in the contamination. This may serve as an indicator that there is contamination. If the resistance decreases below a certain value, it may trigger an indication that the conductivity underneath a component may lead to degraded performance or failure.

The present invention provides an apparatus, system and method for gathering information and data on a timely basis regarding the reliability in and around the electronic circuit card.

Embodiments of the present invention also provide the ability to transmit or communicate the data from the traces and monitor to a device for computation or for decision based information communication outside the board or circuit. The communication system utilized may, for example, be one of wireless (Wi-Fi, Bluetooth, cellular, nearfield communication), wired (serial Ethernet or parallel connections), optical (such as fiber optic or infrared), or other communication method understood by those skilled in the art of communications. All of these methods may be used for data acquisition from sensor to microprocessor or computational system and then to an end user or end device. It is understood that a combination of communication methodologies may also be used.

Data transmission is versatile and may be processed and conveyed via Bluetooth connection to an end user device, such as a laptop, smart phone or other device. An end user or computer program can further process the conveyed information to determine acceptable, or unacceptable, product conditions.

Data processing and conveyance of information may be performed onboard, but with separate circuitry to an end user device. As an example, use separate circuitry may be used for systems that already utilize a Bluetooth transceiver with sufficient bandwidth margins to allow additional data transmission.

Large scale data storage, manipulation and analysis may be necessary depending on the context of the contamination monitoring environment. Processed data may be produced within an integrated circuit and transmitted to an end user device for further computation and assessment. The device may be logged into a server location that serves as a storage area for the data. Automatic uploading of data may be performed when the device accesses the internet. This may be useful for environments that require remote access to health records and may be part of a larger network of equipment.

A cellular transceiver may be used within the circuitry of the device. The system can communicate directly to a server and submit its own processed data. This may be useful for assets that require remote access to health records and may be part of a larger network of equipment. This may remove the requirement of a physical access to the system and allow for fully remote system monitoring. It is understood that some access to a cellular signal would be required.

Discreet circuitry may be used to perform data processing, storage, and cellular transmission of data to storage. This may be useful in systems that are remote and already contain a means of storing and transmitting data via a cellular connection.

A central, online, data processing and storage server may be used. A server location may perform data processing tasks. This may allow for the integrated circuit to submit raw data via a cellular connection. The end user may visualize data remotely and may perform data manipulations consistent with the latest research or situational developments without hardware or firmware alterations. This methodology may be useful for remotely deployed assets that are difficult to access, and may exist as part of a networked system.

The on board storage and data transmission may be performed outside of the integrated circuit.

The present invention provides an apparatus, system and method for gathering information and data on a timely basis regarding the reliability in and around the electronic circuit card assembly or system to determine its reliability as it relates to electrochemical failure modes or conditions that could adversely affect performance over time.

FIG. 1 shows an on circuit monitor from the underside view of a chip. For the example shown in FIG. 1, a leakage current detector is shown as an embodiment of the invention. The underside of a chip, or board, 100 is shown. The chip 100 shown is roughly modeled after a QFN. A QFN is a Quad Flat No-leads package that is typically used in surface mounted electronics designs. It is understood that other types of sensors may be used on similar designs and that other types of circuit packaging may be used. The example of FIG. 1 is not intended to limit the invention to any particular type product or monitoring.

Power connection 120 allow for power to be applied to the chip. The chip 100 also shows a pair of thermal pads 150. The thermal pads 150 are shown divided in this example. There may be a singular thermal pad 150. A thermal pad 150 allows for the transfer of heat. Two non-connected connection (NC) 130 are shown on the chip 100. The NC 130 connections are not connected to a silicon die. As noted elsewhere, the presence of non-connected connections is common practice in many chip packages. The embodiment shown here advantages the NC connectors 150.

A sensor 140 is shown connected between and to the NC connectors 150. The sensor shown is a metal film deposited across the surface of the chip 100. As noted, this embodiment shows the metal film sensor 140 deposited on the underside of the chip 100. The metal film sensor 140 can be created by any appropriate method. The NC 130 pads on the chip are utilized to make electrical connections. One of the NC pads 130 will lead to a detecting circuit 160 and ground. Any current that leaks across the chip 100 from one of the VCC 120 into the other will generally flow through the sensor down to the board 100 through an NC pin 130 and to the detector circuit 160. The detection circuit is then shown connecting, in an appropriate manner as described elsewhere, with an end use device 170 for assessment and evaluation.

The computation and analysis of raw data from the sensor 140 may be performed as appropriate at the detecting circuit 160 or at the end use device 170. The detecting circuit may also be on the board 100. It is also understood that the sensor shown in FIG. 1 is that of a current leakage detector for purposes of example. The sensor 140 may be any suitable type of detector.

Figure 2:
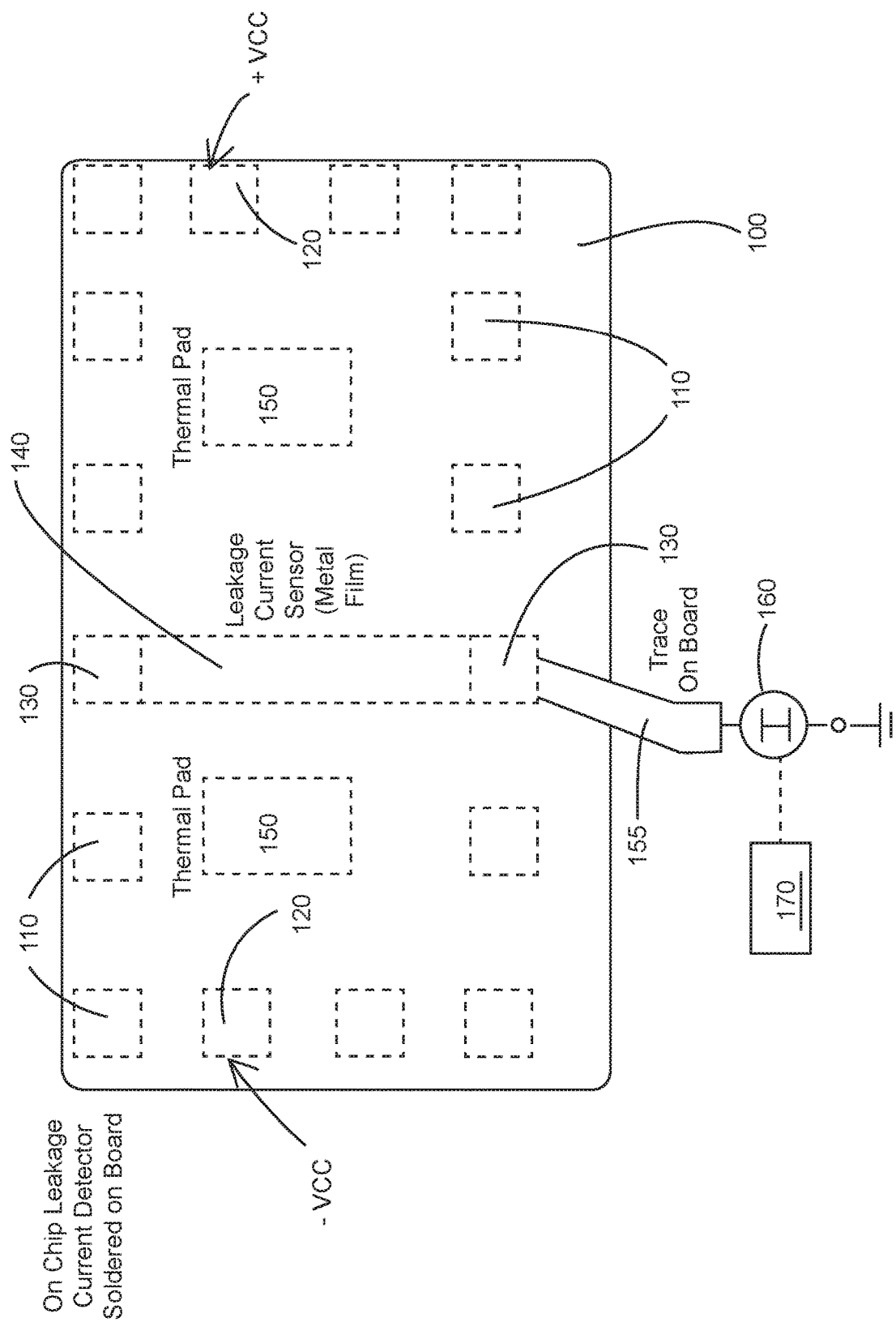
FIG. 2 show an on circuit monitor from the top side of a chip.

FIG. 2 shows an on circuit monitor from the top side of a chip. For purposes of the example, this is the same sensor shown in FIG. 1. The dashed elements in FIG. 2 are shown to indicate that they are underneath the board 100. A chip, or board, 100 is shown with a plurality of connection points 110. A power supply 120 connects to a pair of the pins. The NC 130 connections are not connected to a silicon die. As noted elsewhere, the presence on non-connected connections is common practice in many chip packages. The embodiment shown here advantages the NC connectors 150.

A sensor 140 is shown connected between and to the NC connectors 150. The sensor shown is a metal film deposited across the surface of the chip 100. As noted, this embodiment shows the metal film sensor 140 deposited on the underside of the chip 100. The metal film sensor 140 can be created by any appropriate method. The NC 130 pads on the chip are utilized to make electrical connections. One of the NC pads 130 will lead to a detecting circuit 160 and ground. Any current that leaks across the chip 100 from one of the VCC 120 in to the other will generally flow through the sensor down to the board 100 through an NC pin 130 and to the detector circuit 160. The detection circuit is then shown connecting, in an appropriate manner as described elsewhere, with an end use device 170 for assessment and evaluation.

A board trace 155 on the board 100 connects the sensor 140 to the detecting circuit 160 via the non-connected connector 130. The board trace 155 is a standard PCB (Printed Circuit Board) trace that lead to the detector 160 and ground. In this example, the detector 160 is an ammeter. However, it is understood that any circuit or detector capable of providing current leakage detection may be used. Further, it is understood that any circuit may be used for detecting any other characteristic where appropriate.

The computation and analysis of raw data from the sensor 140 may be performed as appropriate at the detecting circuit 160 or at the end use device 170. The detecting circuit may also be on the board 100. It is also understood that the sensor shown in FIG. 1 is that of a current leakage detector for purposes of example. The sensor 140 may be any suitable type of detector.

The chip 100 also shows a pair of thermal pads 150. The thermal pads 150 are shown divided in this example. There may be a singular thermal pad 150. A thermal pad 150 allows for the transfer of heat. Two non-connected connection (NC) 130 are shown on the chip 100.

Figure 3:
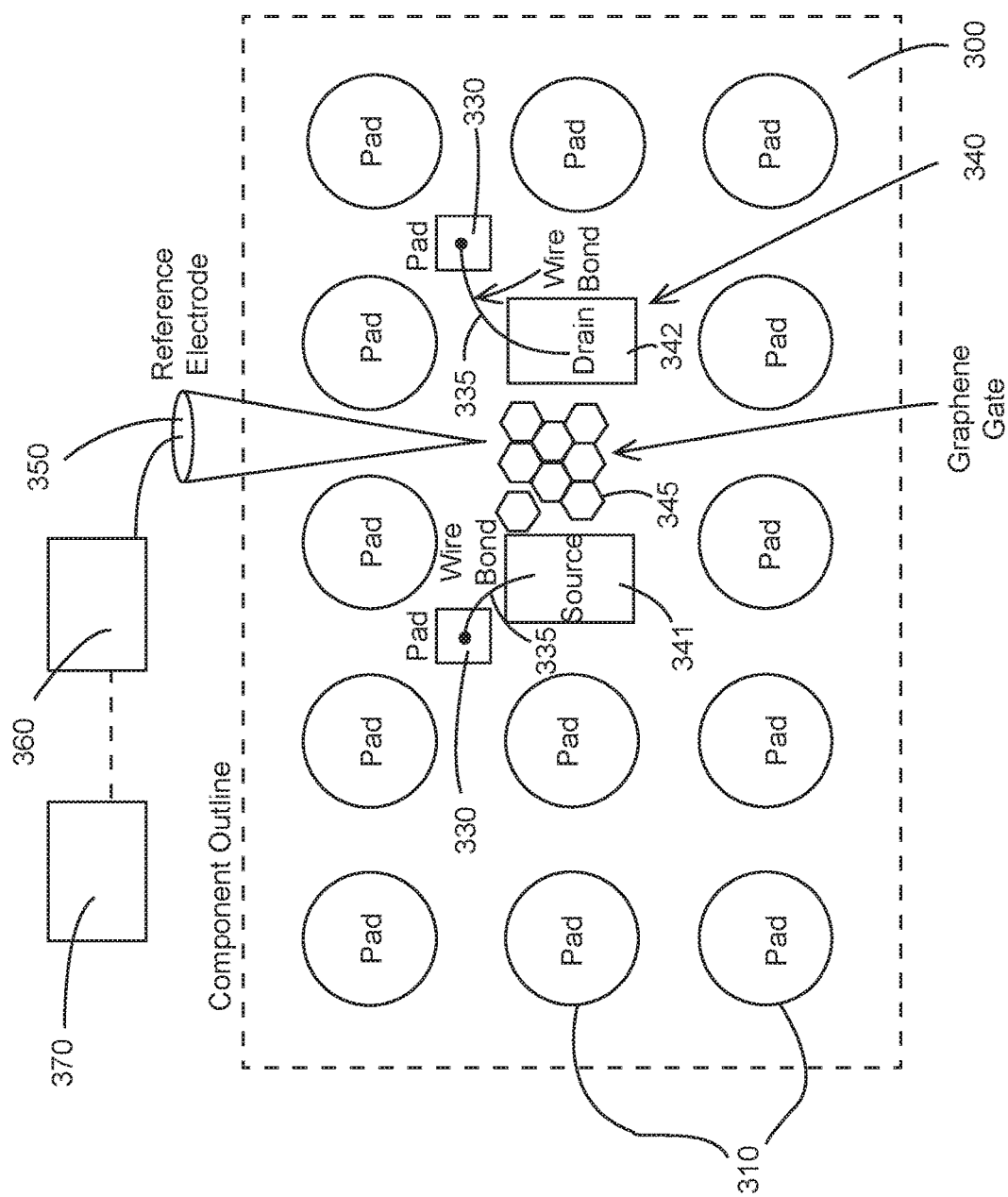
FIG. 3 shows an on board chemical sensor.

FIG. 3 shows an on board chemical sensor. For purposes of the example in FIG. 2, the chemical sensor 340 is based on a graphene field effect transistor (GFET). In an embodiment, the chemical sensor 340 GFET is a thin and small chip that is attached to the board 300 before other critical components are added over it. In an alternative embodiment, the chemical sensor 340 GFET may be entirely integrated into the board 300. In both embodiments, the chemical sensor 340 GFET is situated under the other components on the board 300. A plurality of pads 310 are also shown on the board 300. The pads 310 provide connection points for the component (not shown) which will sit atop the sensor 340.

Typically, GFETs are capable to measure pH and are scalable to be able to fit under other components on the board 300. As those skilled in the art will know, a GFET is typically made of a silicon substrate. Graphene is the only form of carbon (or solid material) in which every atom is available for chemical reaction from two sides. Graphene is also a zero-gap semiconductor. The chemical sensor 340 GFET is comprised of a source 341, a drain 342 and a graphene gate 345. The source 341 and the drain 342 are shown wire bonded 335 to pads 330 on the circuit board 300. The wire bonding 335 to the pads 330 may be done in conventional fashion as understood by those skilled in the art. As the pH changes based on chemical sensing, the current changes in a predictable manner. The current can be monitored. A reference electrode 350 connects to the chemical sensor 340 GFET. The electrode 350 provides monitoring capability as part of a monitor 360, or separately from the monitor 360 (as shown). The monitor 350 is then shown connecting, in an appropriate manner as described elsewhere, with an end use device 370 for assessment and evaluation.

The computation and analysis of raw data from the sensor 340 may be performed as appropriate at the detecting circuit 160 or at the end use device 370. The detecting circuit may also be on the board 300. It is also understood that the sensor shown in FIG. 3 is that of a chemical detector for purposes of example. Other chemical sensors may be used as appropriate for the intended use of the component and board.

Figure 4:
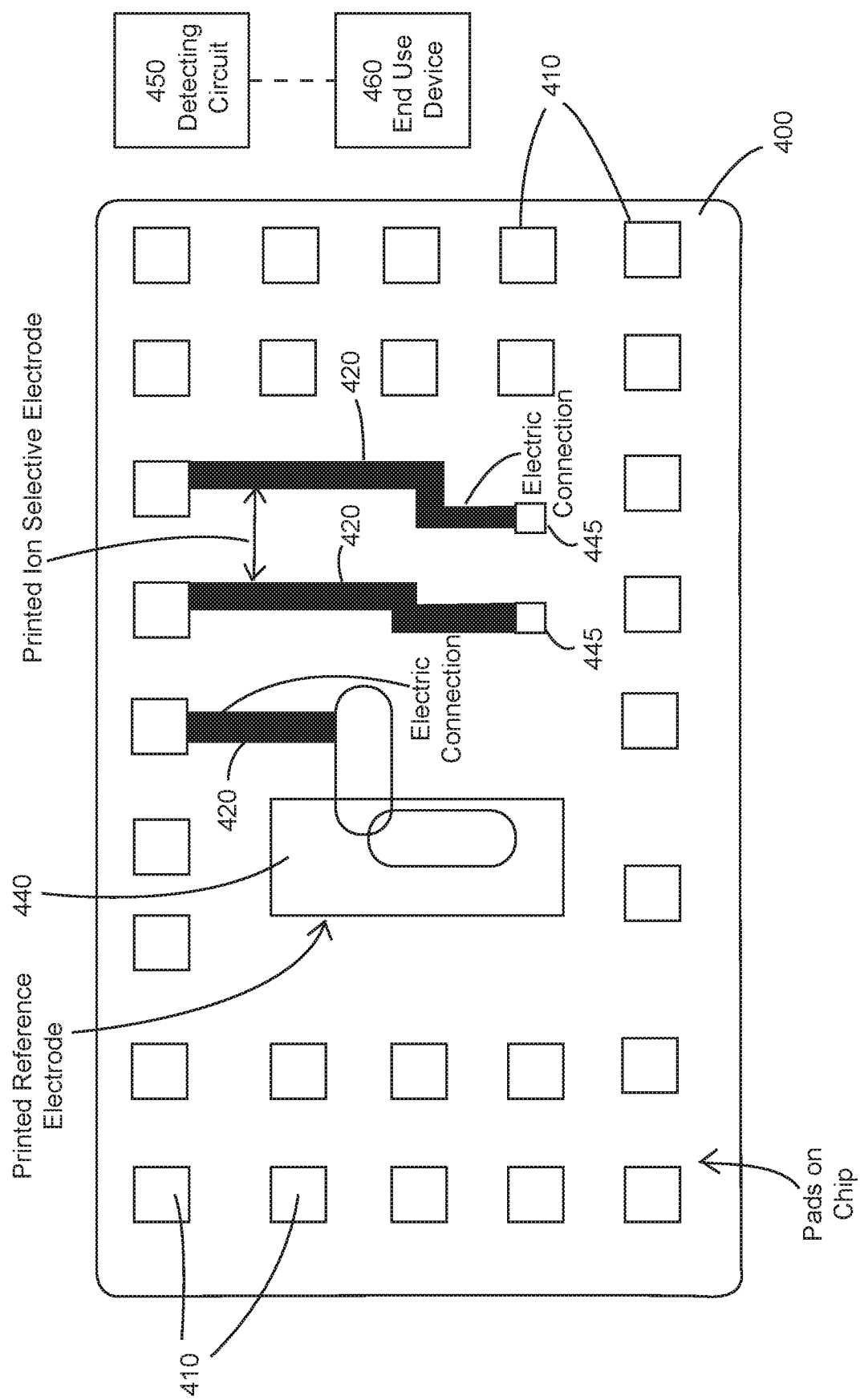
FIG. 4 shows an ion selective electrode on a printed circuit board.

FIG. 4 shows an ion selective electrode on a printed circuit board. The underside of a board 400 is shown. The board 400 has a plurality of pads 410 which are soldered or otherwise attached to the board. A plurality of electrical connections between pads 410 are shown. An electrode 440 is also shown with an electrical connection 420 to a pad 410. The electrode 440 is an ISE (Ion Selective Electrode). An ISE is a transducer (or sensor) that converts the activity of a specific ion dissolved in a solution into an electrical potential. The voltage is dependent on the level of ionic activity. In essence, the ISE 440 changes its voltage in proportion to a substance that interacts with the electrodes. The ISE 440 may be small ion selective electrode screen printed on the board 400.

The electrical connections 420 show electrical connections to the chip. These electrical connections may be metallic traces. Those skilled in the art will understand a variety of methods of providing electrical connections on a printed circuit board. The electrical connections lead to pads on the chip that may be connected to circuitry on the board 400 to enable ISE measurements. The pads 410 may also be connected to other pads 410 that carry signals to the traces on the board 400 that lead to the circuitry for ISE measurements. The sensing materials 445, which may be a polymer or inorganic crystal for example, provide sensing input via the electrical connections 420 to the electrode 440. The electrode 440 may be connected to a detecting circuit via any method. Those skilled in the art will understand how to connect the electrode 440 to the detection circuit. The detection circuit may be connected to an end use device 445. It is understood that the sensing material 445 may be any material capable of sensing ionic activity.

The computation and analysis of raw data from the sensor 445 and electrode 440 may be performed as appropriate at the detecting circuit 450 or at the end use device 460. The detecting circuit may also be on the board 400. It is also understood that the sensor shown in FIG. 4 is that of a ion selective electrode for purposes of example. The sensor 445 may be any suitable type of detector.

Figure 5:
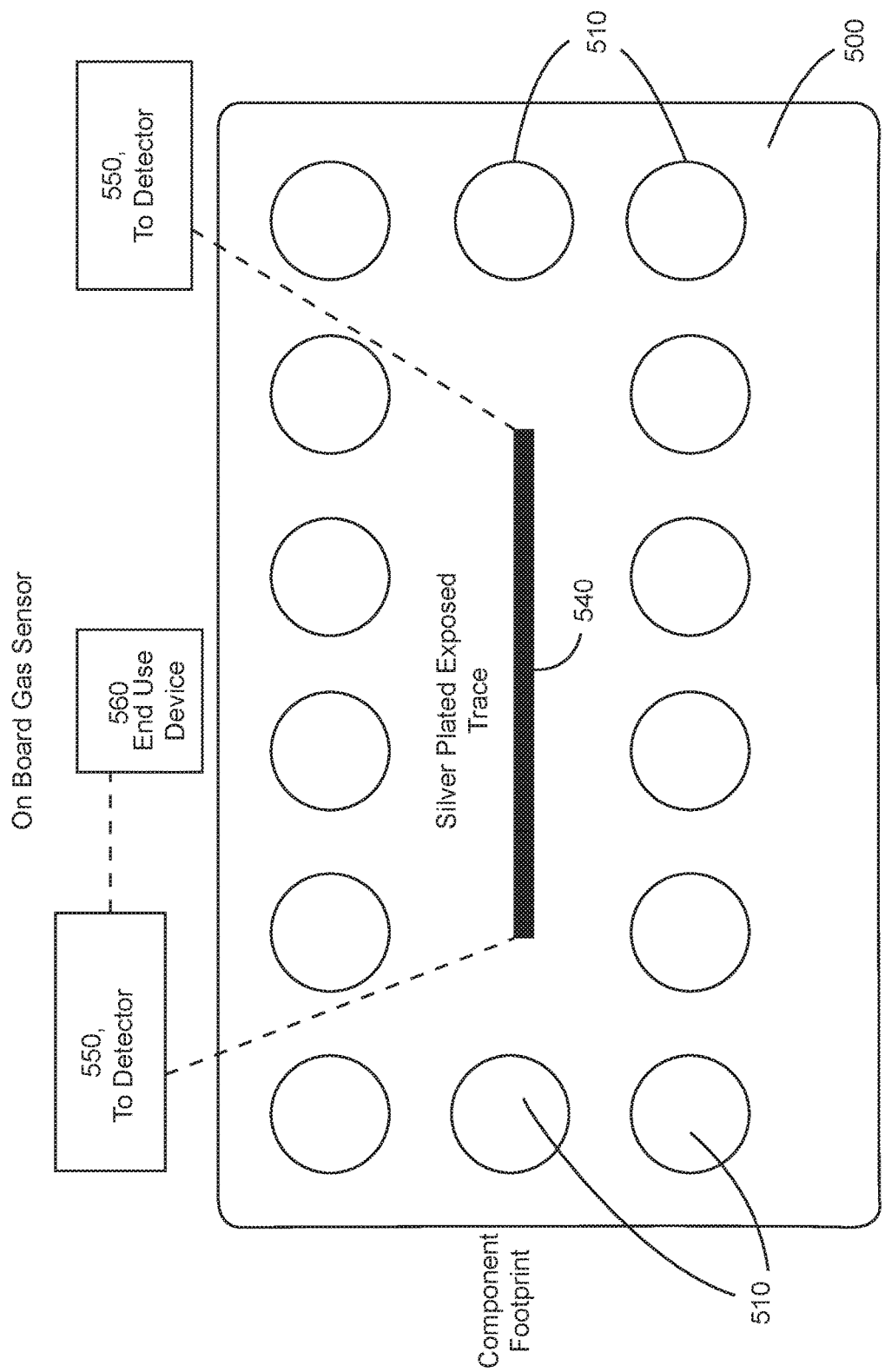
FIG. 5 shows an on board gas sensor.

FIG. 5 shows an on board gas sensor. The board 500 has a plurality of pads 510. A trace 540 is on the board 500. The trace 540 may be a silver plated exposed trace. The trace 540 may be manufactured and plated in a conventional process. As shown, a portion of the trace 540 is on the surface of the board 500 and the silver is exposed to the environment (below components). The trace 540 connects to an appropriate detector circuit 550. The detector circuit 550 may be enabled to detect either resistance changes in the trace 540 or when the circuit is in an open, or disconnected, state. As an example, sulfurous gasses (sulfur, sulfur dioxide, hydrogen sulfide, etc.) are very corrosive toward silver. As the silver trace corrodes, changes in the electrical resistance of the trace 540 result. This is due to the corrosion causing the silver to change into non-conductive silver sulfide (AgS). The trace 540 is plated to the board in a manner that makes it smaller and thinner than other silver parts on the board 500. Because the trace 540 is thinner than other silver plated connection on the board 500, the failure of the trace 540 occurs faster. Failure of the trace 540 provides an indication of possible impending degradation or failure of the components on the board. The component would sit over the top of the trace 540.

The detector 550 may be any suitable means for determining the resistance of the trace 540. The detection circuit 550 is then shown connecting, in an appropriate manner as described elsewhere, with an end use device 560 for assessment and evaluation. The computation and analysis of raw data from the sensor 540 may be performed as appropriate at the detecting circuit 550 or at the end use device 560. Further, it is understood that other types of traces may be utilized depending on the nature of the environment involved. For instance, a chip may be intended for an environment that has a different type of gas and a particular metal may corrode specifically with regard to that gas. Those skilled in the art will understand the corrosive effects of different gasses on different metals.

Figure 6:
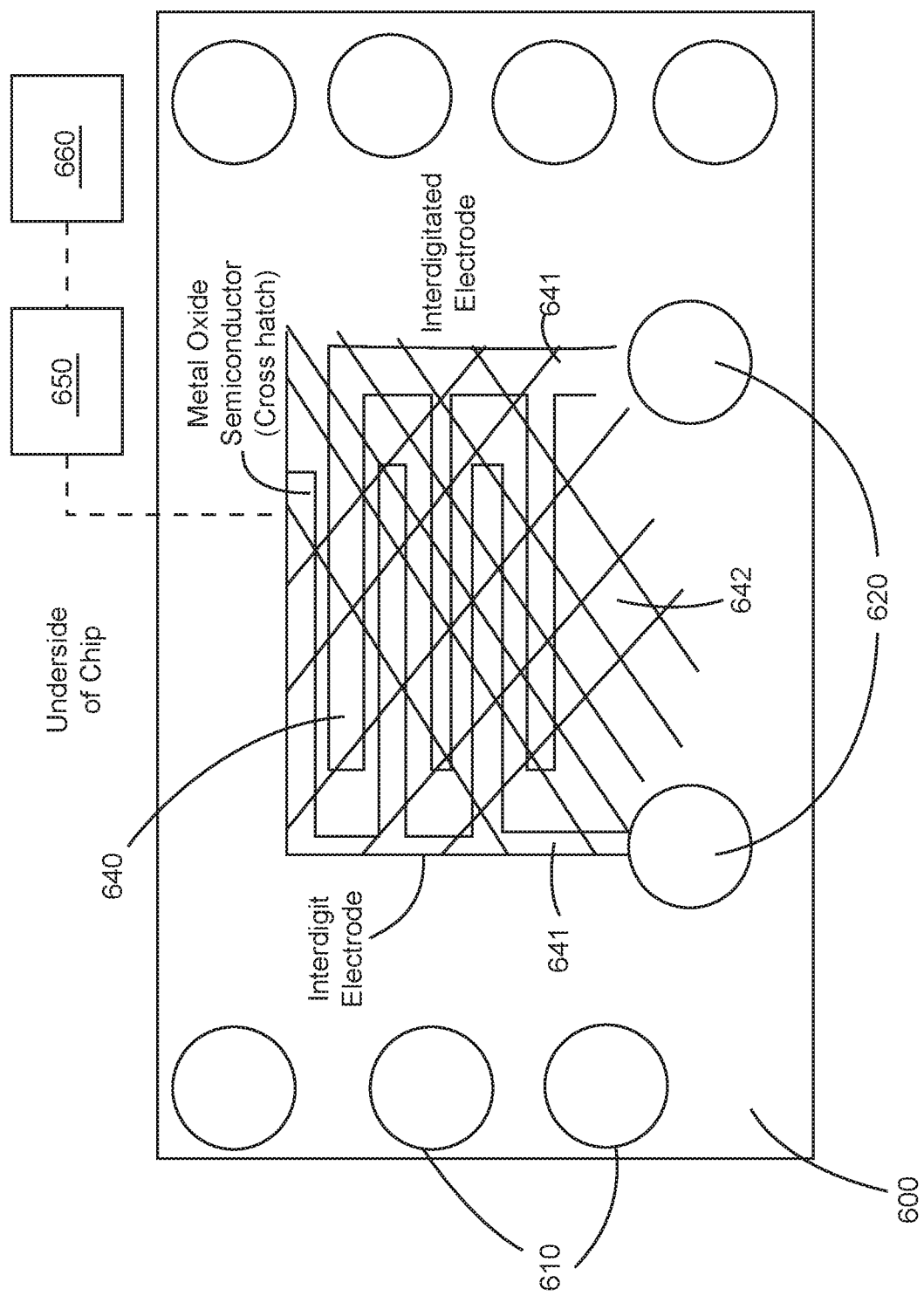
FIG. 6 shows an on chip gas sensor.

FIG. 6 shows an on chip gas sensor. A board, or chip, 600 is shown with a plurality of pads 610. A sensor 640 is placed on the board 600. The sensor 640 may be on the underside of the board 600 or may be under a component. The sensor 640 connects to a detector 650 by any suitable means. The detector connects to an end use device 660 by any suitable means.

The sensor 640 is a metal oxide semiconductor chemiresistor. Those skilled in the art will understand the gas sensing techniques utilizing such a chemiresistor. The sensor 640 connects to two NC pads 620 on the board. The sensor 640 is comprised of two interdigitated electrodes 641 covered by a semiconductor metal oxide 642. Each of the electrodes 641 connects to one of the NC pads 620. In the FIG. 6, the cross-hatching over the electrodes 641 is used to indicate the metal oxide layer 642 over the electrodes 641. The electrodes 641 and metal oxide 641 may be deposited on the board 600 using any suitable deposition technique. As the metal oxide 642 corrodes, the conductivity changes and a detector 650 connected to the NC pads 620 will be able to sense the change. The detector connects to an end use device 660.

The detector 650 may be any suitable means for determining the electrical characteristics of the electrodes 641. The detection circuit 650 is then shown connecting, in an appropriate manner as described elsewhere, with an end use device 660 for assessment and evaluation. The computation and analysis of raw data from the sensor 640 may be performed as appropriate at the detecting circuit 650 or at the end use device 660. Further, it is understood that many suitable types of metal oxides 642 may be utilized depending on the nature of the environment involved. For instance, a chip 600 may be intended for an environment that has a different type of gas and a particular metal may corrode specifically with regard to that gas. Those skilled in the art will understand the corrosive effects of different gasses on different metals.

Figure 7A:
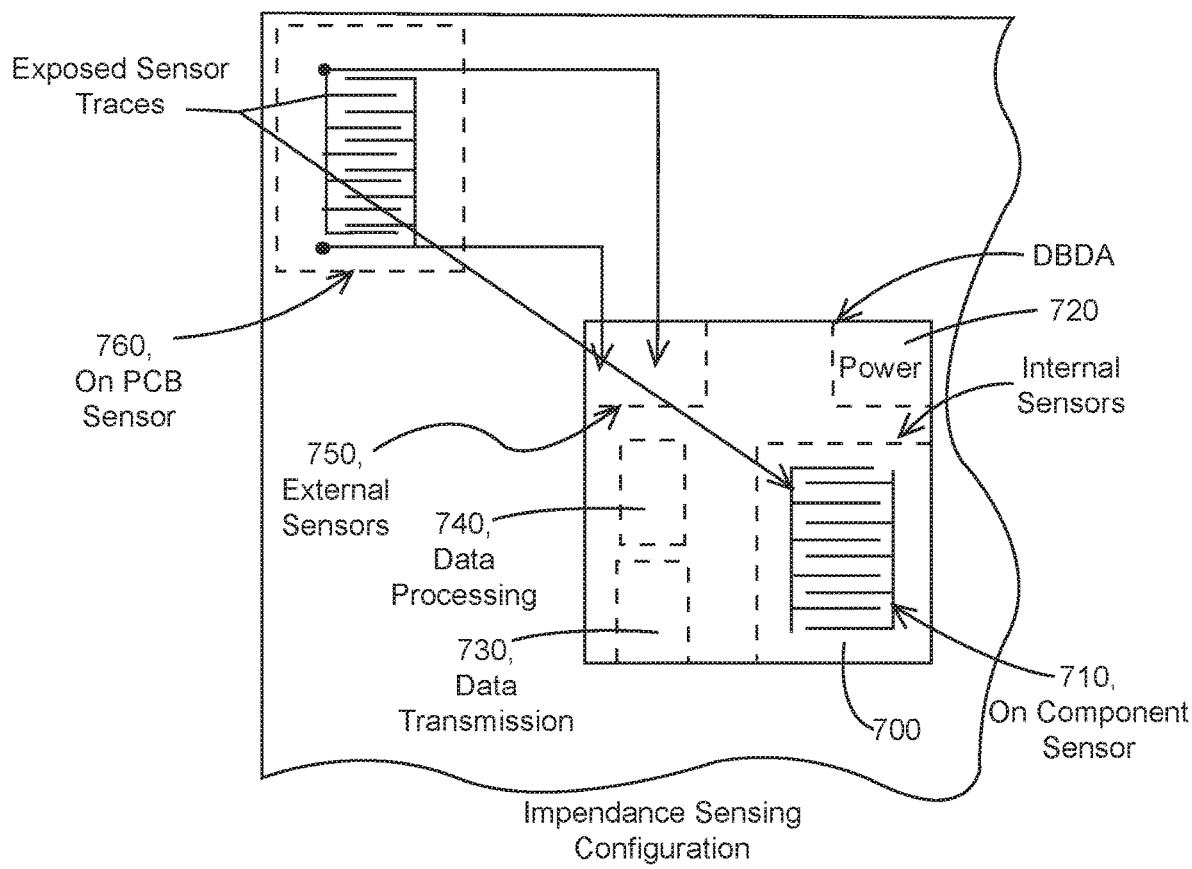
FIG. 7a shows an impedance sensing configuration.

FIG. 7a shows an impedance sensing configuration. A board 700 is shown with an on component sensor 710, a power section 720, a data transmission section 730, a data processing section 740 and external sensors 750. The external sensor 760 may be a sensor that is on the board 700. Accordingly, FIG. 7 is showing both alternatives, the on board and the on component sensor. It is understood that the on board sensor may be used solely, the on component sensor may be used solely or both sensors may be used in combination. The on component sensor 710 and the on board sensor 760 may each comprise two interdigitated electrodes. The two interdigitated electrodes provide an impedance sensing mechanism. The sensor provides information to a detector (not shown—but similar to FIGS. 1-6) which may then provide information to an end use device (not shown—but similar to FIGS. 1-6).

Figure 7B:
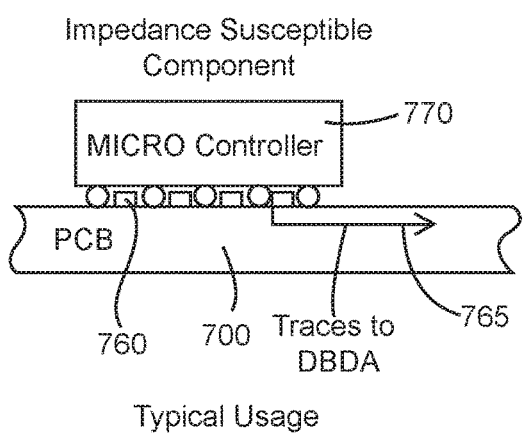
FIG. 7b shows typical usage of an impedance sensing configuration.

FIG. 7b shows typical usage of an impedance sensing configuration. A board 700 is shown with a component microcontroller 770. A sensor 760 is under the microcontroller 770. The sensor connects via a connection 765 to a detector circuitry (not shown) suitable for the monitoring of changes in impedance.

Figure 8A:
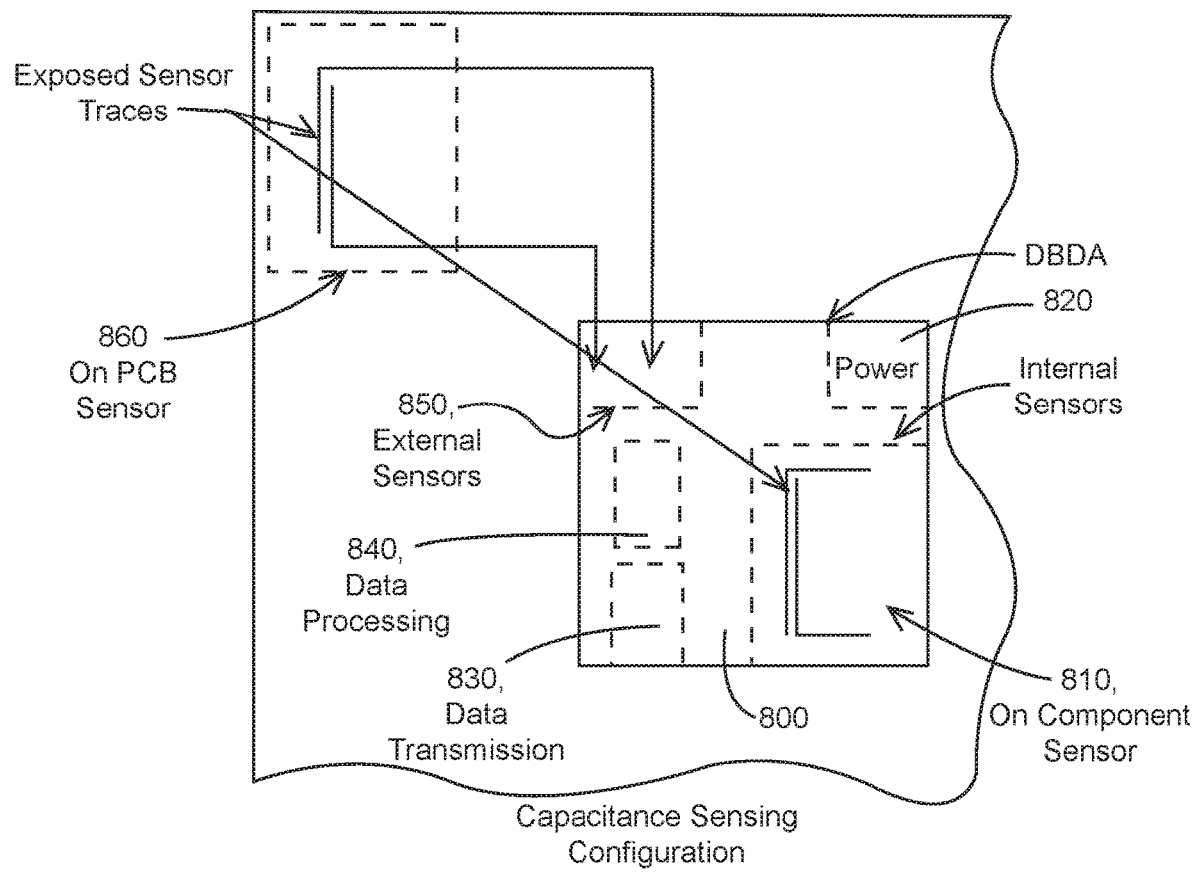
FIG. 8a shows a capacitance sensing configuration.

FIG. 8a shows a capacitance sensing configuration. A board 800 is shown with an on component sensor 810, a power section 820, a data transmission section 830, a data processing section 840 and external sensors 850. The external sensor 860 may be a sensor that is on the board 800. Accordingly, FIG. 8 is showing both alternatives, the on board and the on component sensor. It is understood that the on board sensor may be used solely, the on component sensor may be used solely or both sensors may be used in combination. The on component sensor 810 and the on board sensor 860 comprise a pair of parallel electrodes capable of changing capacitance. The electrodes will electrically connect a detector (not shown) in a suitable manner that is enabled to monitor the capacitance of the electrode pair and the detector will suitably connect to an end use device (not shown).

Figure 8B:
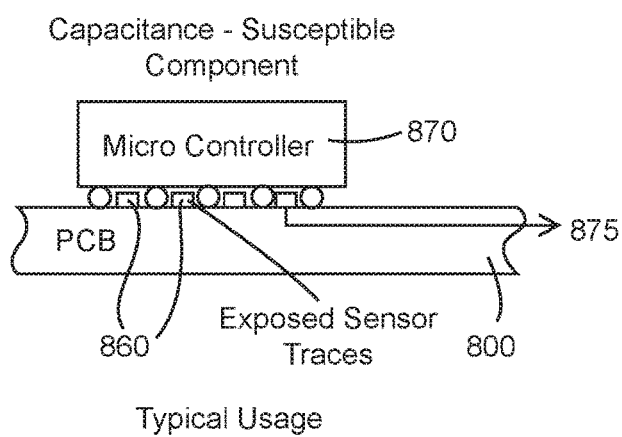
FIG. 8b shows typical usage of capacitance sensing configuration.

FIG. 8*b* shows typical usage of capacitance sensing configuration. A board 800 is shown with a component microcontroller 870. A sensor 860 is under the microcontroller 870. The sensor connects via a connection 875 to a detector circuitry (not shown) suitable for monitoring of changes in capacitance.

Figure 9A:
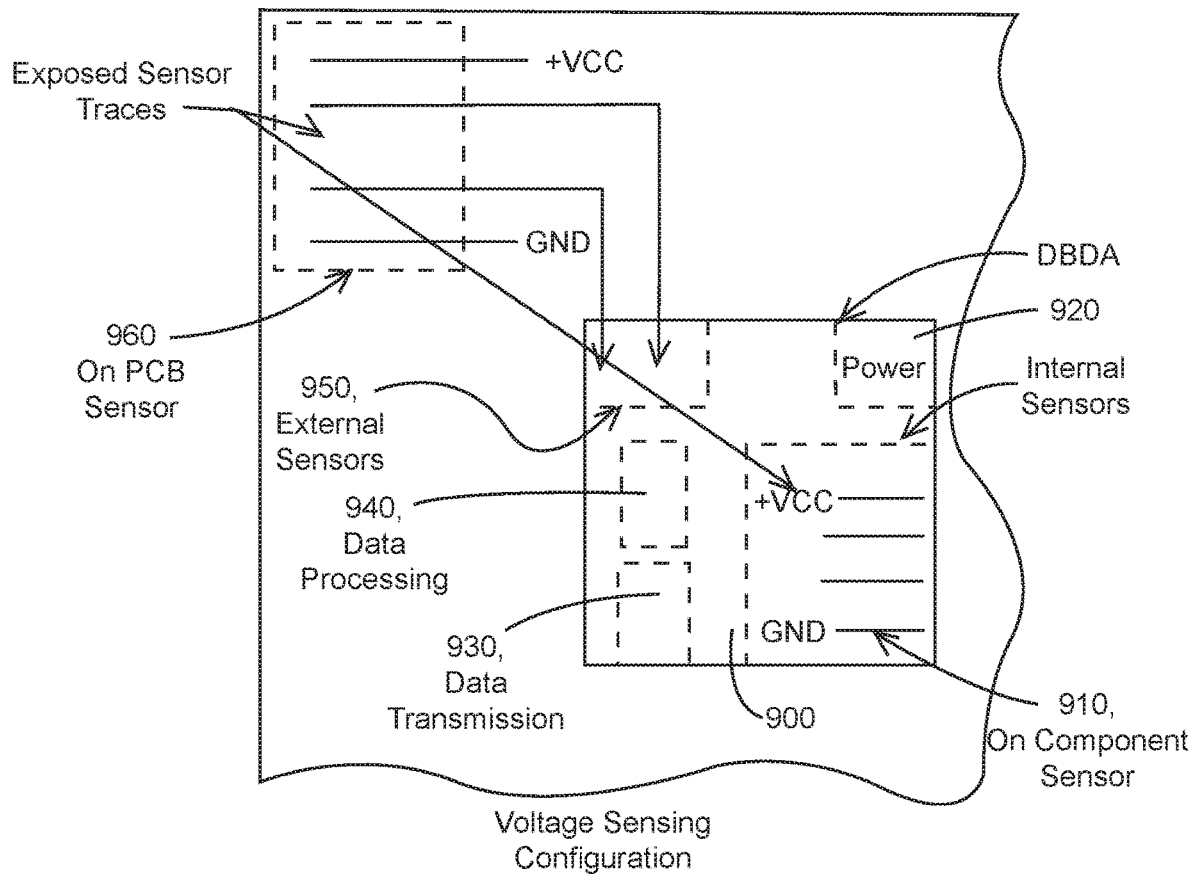
FIG. 9a shows a voltage sensing configuration.

FIG. 9*a* shows a voltage sensing configuration. A board 900 is shown with an on component sensor 910, a power section 920, a data transmission section 930, a data processing section 940 and external sensors 950. The external sensor 960 may be a sensor that is on the board 900. Accordingly, FIG. 9 is showing both alternatives, the on board and the on component sensor. It is understood that the on board sensor may be used solely, the on component sensor may be used solely or both sensors may be used in combination. The on board sensor 960 and the on component sensor 910 comprise a voltage source, a ground and a pair of traces. These provide a voltage sensing mechanism. As voltage across the sensors varies, the sensor provides information to a detector (not shown).

Figure 9B:
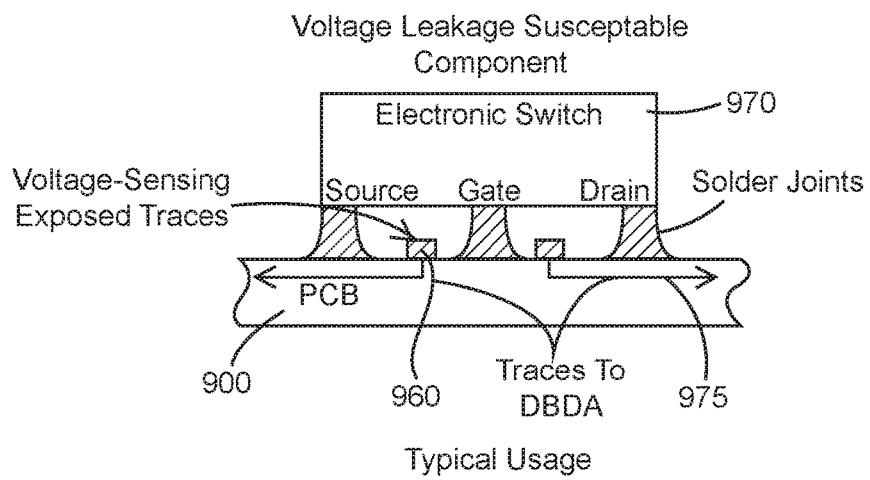
FIG. 9b shows typical usage of a voltage sensing configuration.

FIG. 9*b* shows typical usage of a voltage sensing configuration. A board 900 is shown with an electronic switch 970. The switch 970 is shown connected to the board 900 via the source, gate and drain of the switch 970, which would be a normal installation. Traces 960 connect via a connection 975 to a detector circuitry (not shown) suitable for monitoring voltage changes between the traces 960.

Figure 10A:
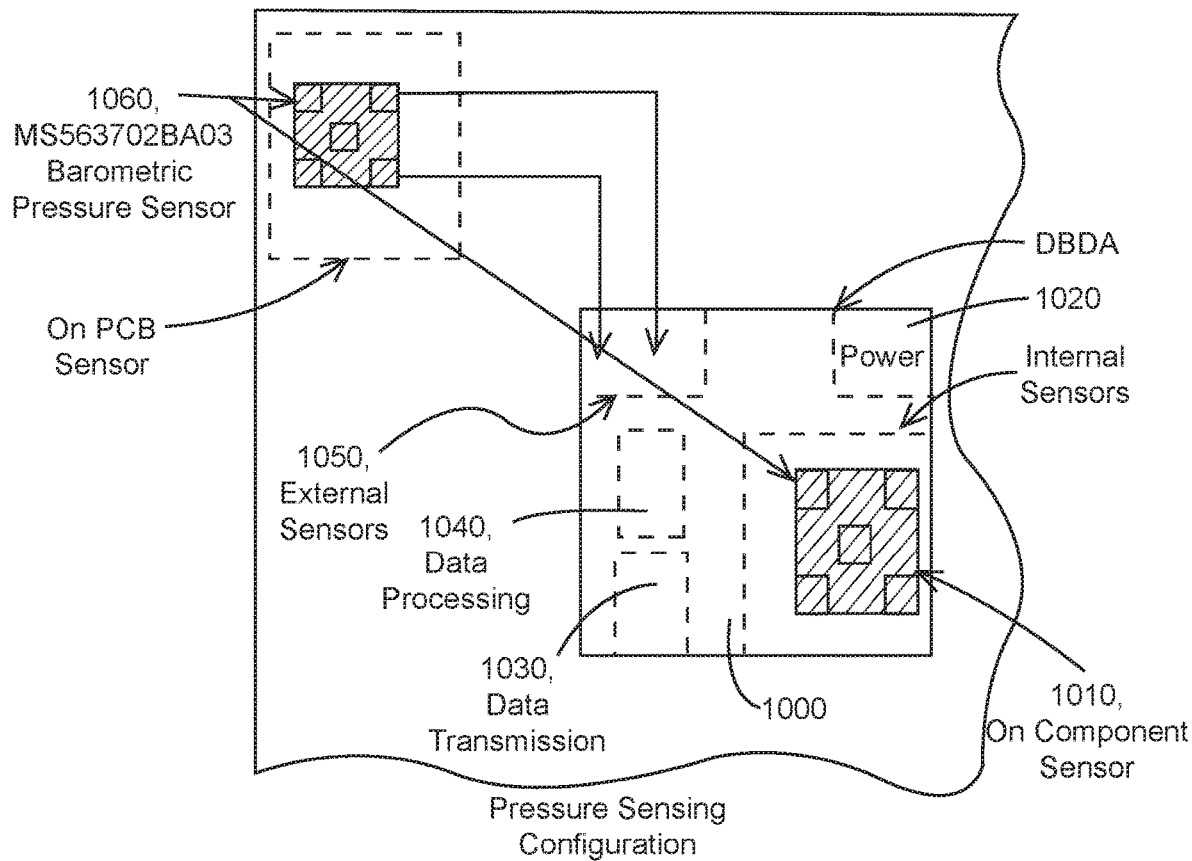
FIG. 10a shows a pressure sensing configuration.

FIG. 10*a* shows a pressure sensing configuration. A board 1000 is shown with an on component sensor 1010, a power section 1020, a data transmission section 1030, a data processing section 1040 and external sensors 1050. The external$_{[HG1]}$ sensor 1060 may be a sensor that is on the board 1000. Accordingly, FIG. 10 is showing both alternatives, the on board and the on component sensor. It is understood that the on board sensor may be used solely, the on component sensor may be used solely or both sensors may be used in combination. The on component sensor 1010 and the on board sensor 1060 comprise a barometric pressure sensor. The sensor provides information to a detector (not shown) which may then provide information to an end use device (not shown).

Figure 10B:
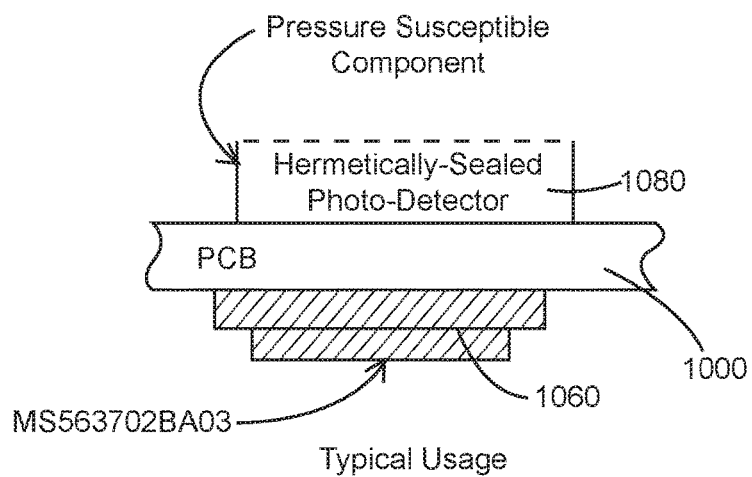
FIG. 10b shows typical usage of a pressure sensing configuration.

FIG. 10*b* shows typical usage of a pressure sensing configuration. A board 1000 is shown with a photo-detector 1080. A photo-detector may be susceptible to changes in barometric pressure. The barometric pressure sensor 1060 is under the board 1000. The sensor 1060 connects via a suitable connection to a detector circuitry suitable for monitoring of changes in barometric pressure.

Figure 11A:
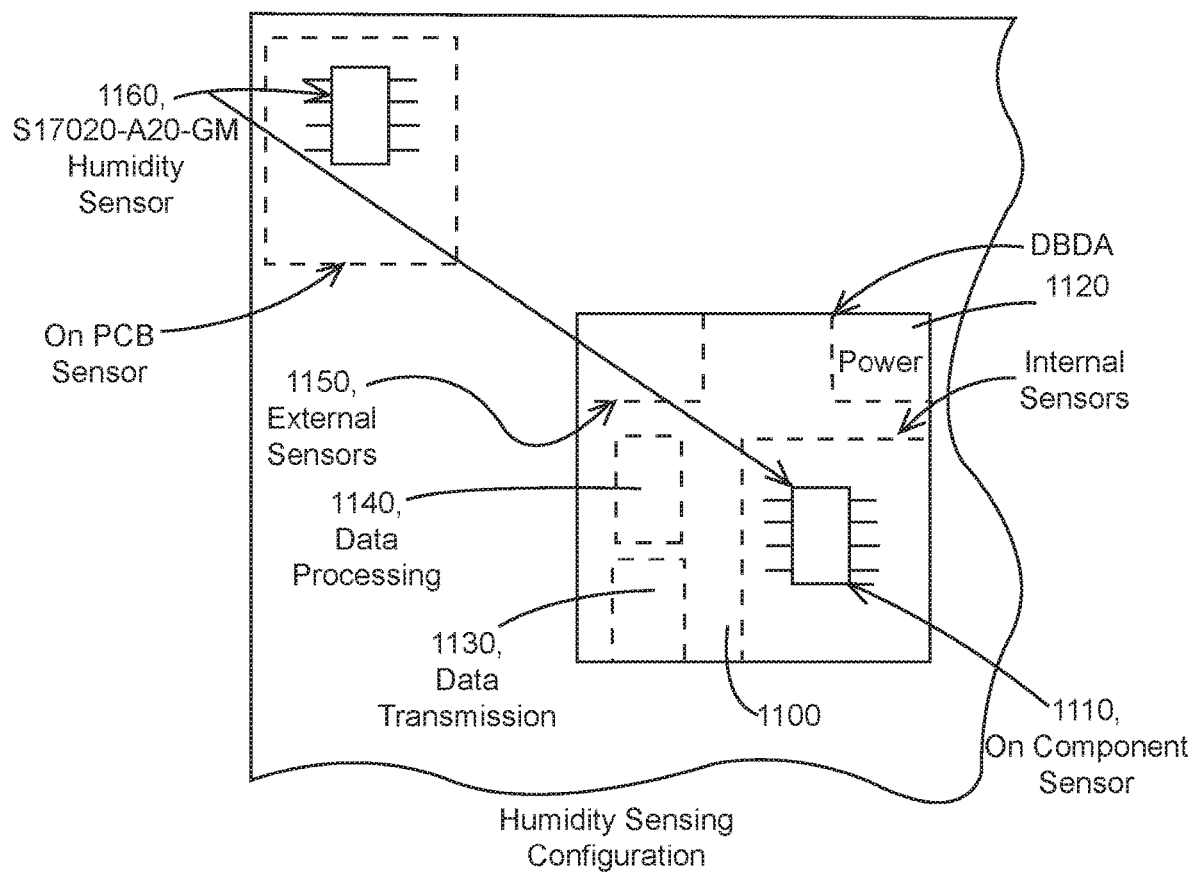
FIG. 11a shows a humidity sensing configuration.

FIG. 11*a* shows a humidity sensing configuration. A board 1100 is shown with an on component sensor 1110, a power section 1120, a data transmission section 1130, a data processing section 1140 and external sensors 1150. The external sensor 1160 may be a sensor that is on the board 1100. Accordingly, FIG. 11 is showing both alternatives, the on board and the on component sensor. It is understood that the on board sensor may be used solely, the on component sensor may be used solely or both sensors may be used in combination. The on component sensor 1110 and the on board sensor 1160 comprise a humidity sensor. The sensor provides information to a detector (not shown) which may then provide information to an end use device (not shown).

Figure 11B:
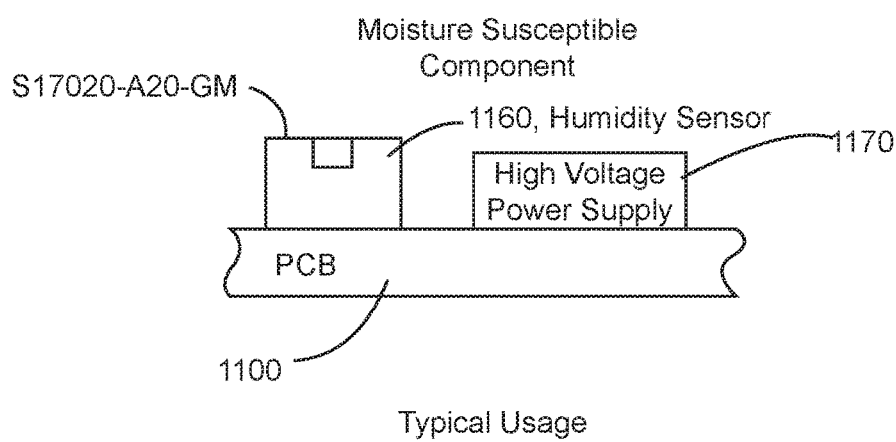
FIG. 11b shows typical usage of a humidity sensing configuration.

FIG. 11*b* shows typical usage of a humidity sensing configuration. A board 1100 is shown with a high voltage power supply 1170. A voltage supply may be susceptible to changes in humidity. The humidity sensor 1160 is on the board 1100. The sensor 1160 connects via a suitable connection to a detector circuitry (not shown) suitable for monitoring of changes in humidity.

Figure 12A:
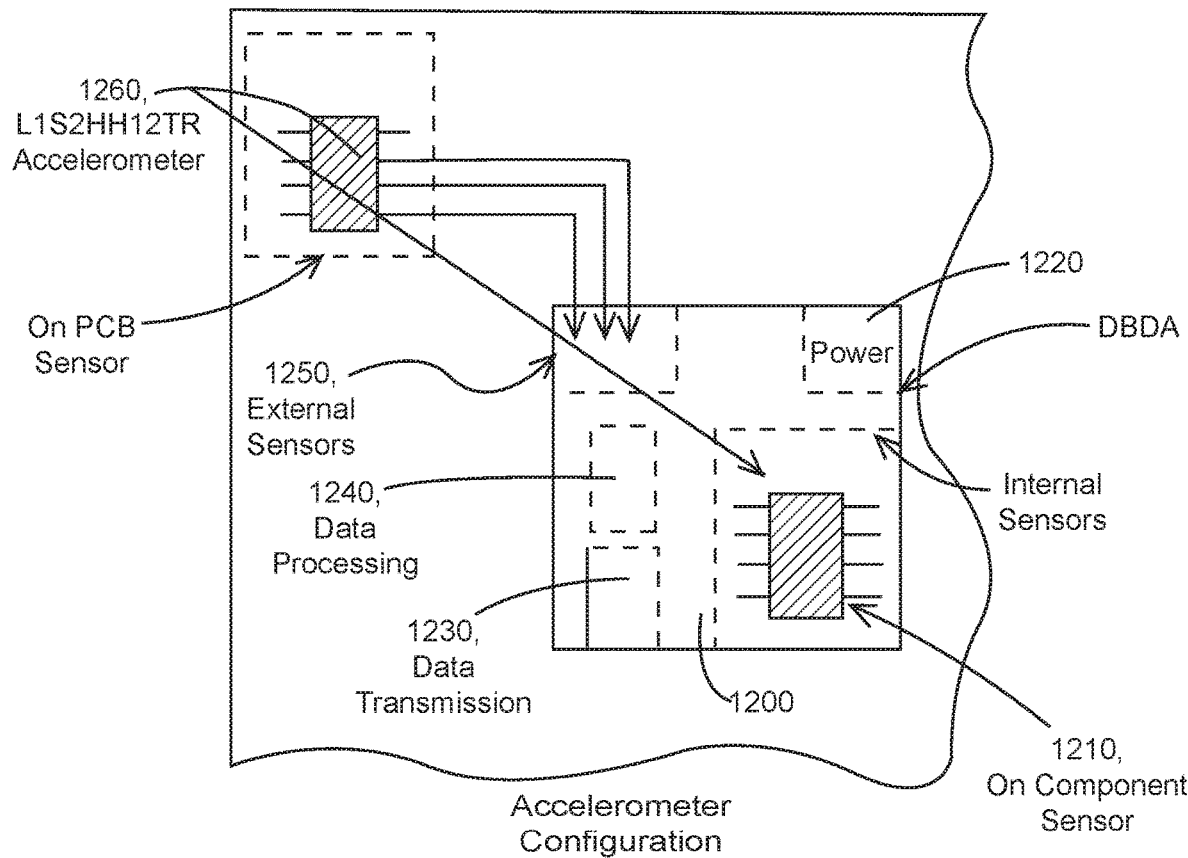
FIG. 12a shows an accelerometer configuration.

FIG. 12*a* shows an accelerometer configuration. A board 1200 is shown with an on component sensor 1210, a power section 1220, a data transmission section 1230, a data processing section 1240 and external sensors 1250. The external sensor 1260 may be a sensor that is on the board 1200. Accordingly, FIG. 12 is showing both alternatives, the on board and the on component sensor. It is understood that the on board sensor may be used solely, the on component sensor may be used solely or both sensors may be used in combination. The on component sensor 1210 and the on board sensor 1260 comprise an accelerometer. The sensor provides information to a detector (not shown) which may then provide information to an end use device (not shown).

Figure 12B:
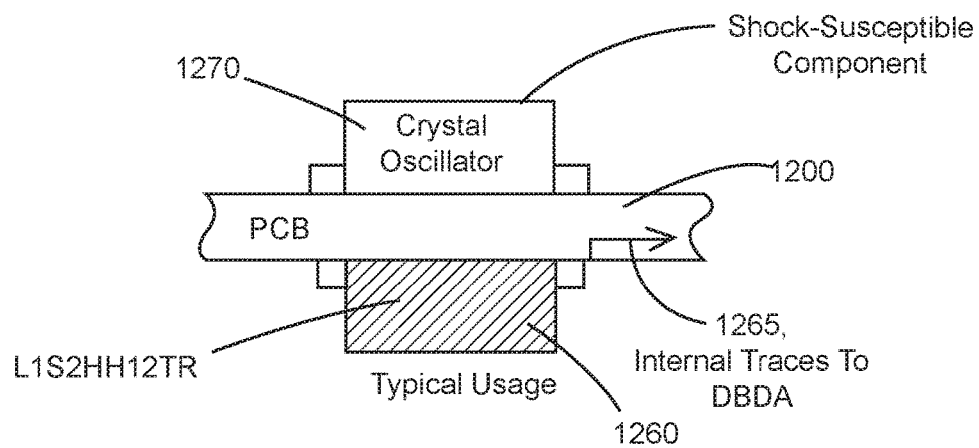
FIG. 12b shows typical usage of an accelerometer configuration.

FIG. 12*b* shows typical usage of an accelerometer configuration. A board 1200 is shown with a crystal oscillator. A crystal oscillator may be sensitive to sudden changes in speed. The accelerometer 1260 is on the board 1200. The accelerometer 1260 connects via a suitable connection (1265) to a detector circuitry (not shown) suitable for monitoring changes in acceleration.

Figure 13A:
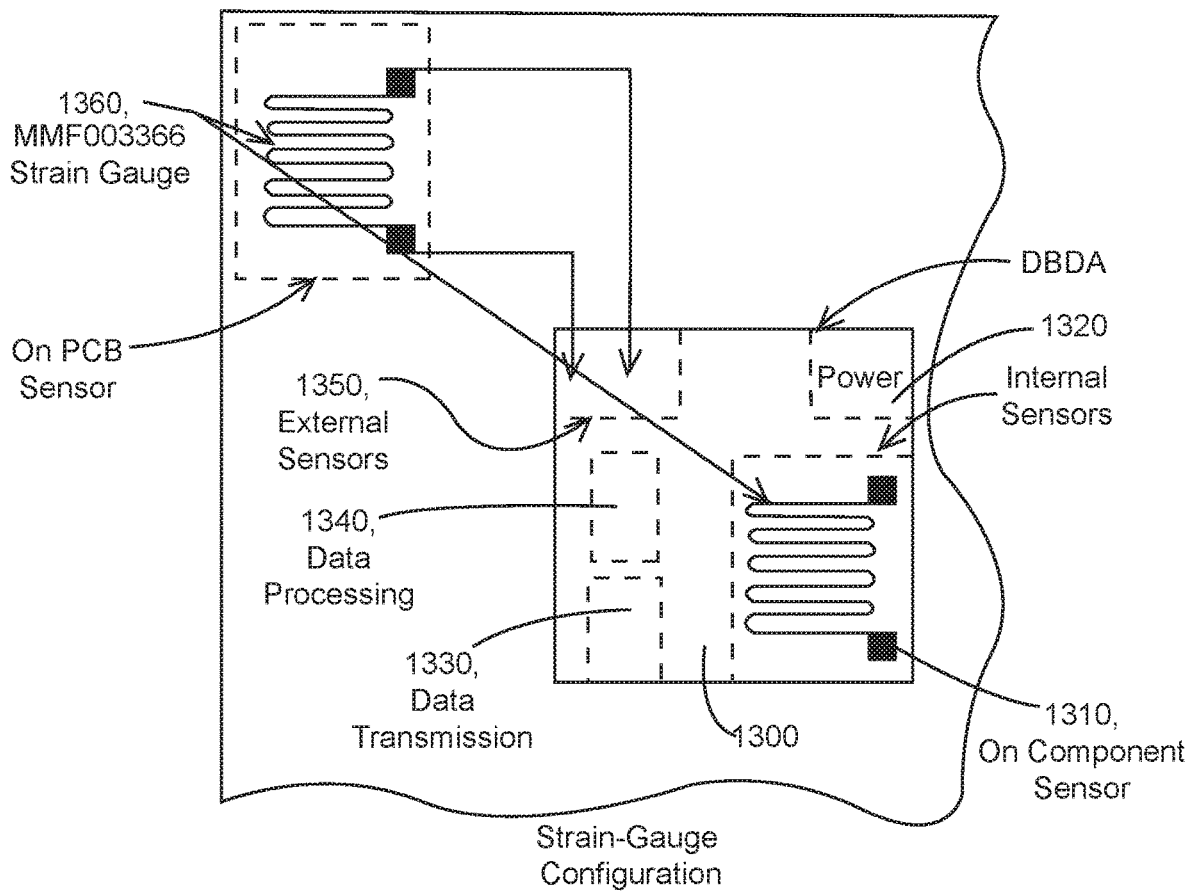
FIG. 13a shows a strain-gauge sensing configuration.

FIG. 13*a* shows a strain-gauge sensing configuration. A board 1300 is shown with an on component sensor 1310, a power section 1320, a data transmission section 1330, a data processing section 1340 an external sensors 1350. The external sensor 1360 may be a sensor that is on the board 1300. Accordingly, FIG. 13 is showing both alternatives, the on board and the on component sensor. It is understood that the on board sensor may be used solely, the on component sensor may be used solely or both sensors may be used in combination. The on component sensor 1310 and the on board sensor 1360 comprise a strain gauge enabled to measure stress levels. The sensor provides information to a detector (not shown) which may then provide information to an end use device (not shown).

Figure 13B:
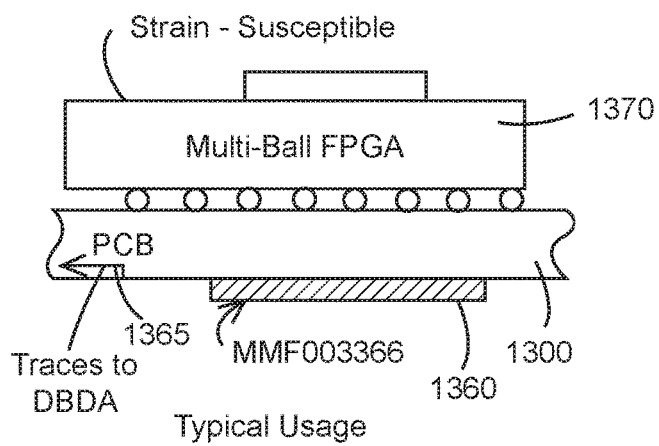
FIG. 13b shows typical of a strain-gauge sensing configuration.

FIG. 13*b* shows typical of a strain-gauge sensing configuration. A board 1300 is shown with a multi-ball FPGA 1370. An FPGA may be susceptible to physical stresses. The strain gauge 1360 connects via a suitable connection 1365 to a detector circuitry (not shown) suitable for monitoring changes is strain.

Figure 14A:
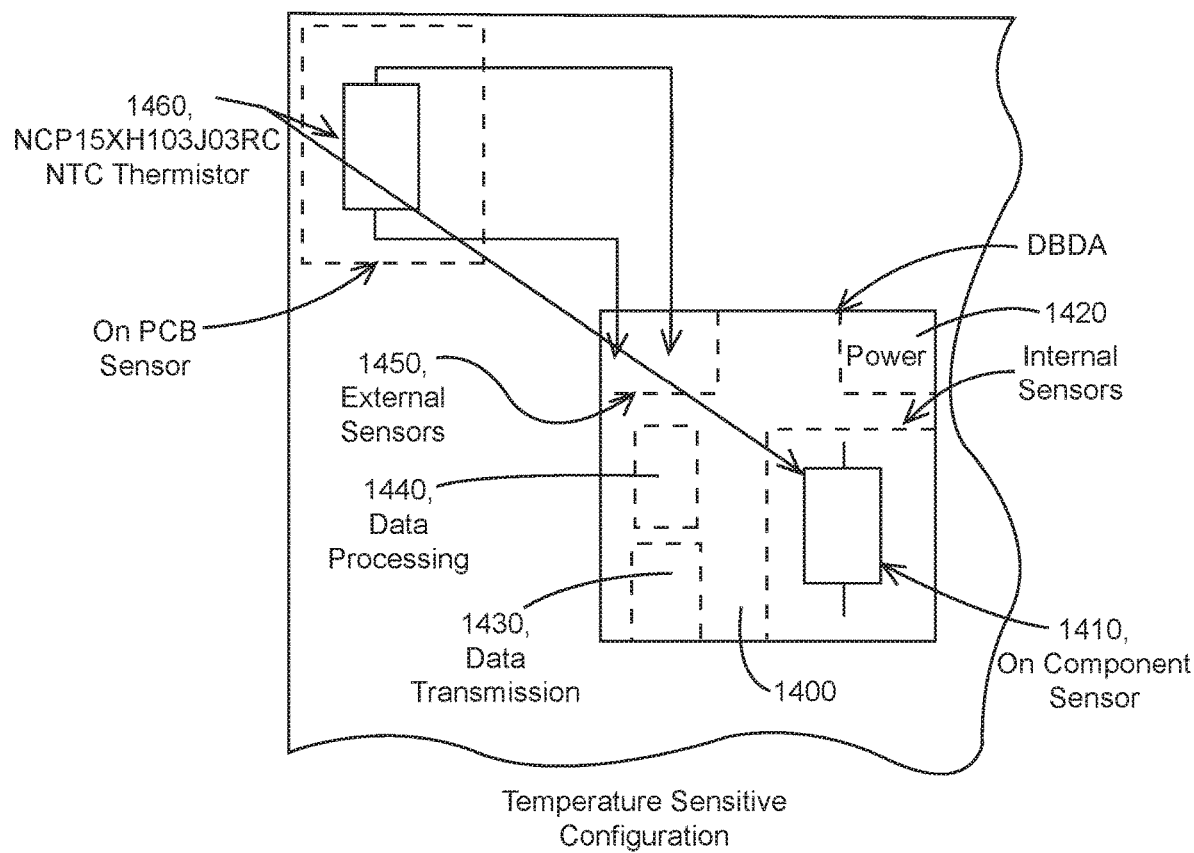
FIG. 14a shows a temperature sensing configuration.

FIG. 14*a* shows a temperature sensing configuration. A board 1400 is shown with an on component sensor 1410, a power section 1420, a data transmission section 1430, a data processing section 1440 an external sensors 1450. The external sensor 1460 may be a sensor that is on the board 1400. Accordingly, FIG. 14 is showing both alternatives, the on board and the on component sensor. It is understood that the on board sensor may be used solely, the on component sensor may be used solely or both sensors may be used in combination. The on component sensor 1410 and the on board sensor 1460 comprise a thermistor enabled to measure temperature changes. The sensor provides information to a detector (not shown) which may then provide information to an end use device (not shown).

Figure 14B:
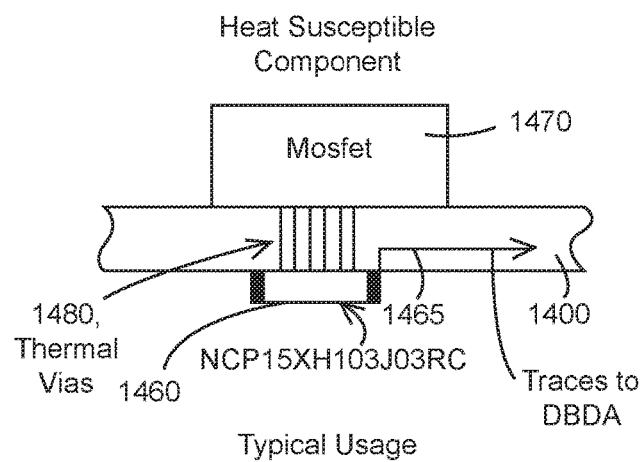
FIG. 14b shows typical usage of a temperature sensing configuration.

FIG. 14*b* shows typical usage of a temperature sensing configuration. A board 1400 is shown win a MOSFET 1470. The MOSFET 1470 may be susceptible to changes in temperature. The thermistor 1460 connects via a suitable connection 1465 to a detector (not shown) suitable for monitoring changes in temperature of the thermistor. The thermistor 1460 connects to the MOSFET 1470 via thermal vias 1480 through the board. The thermal vias 1480 allow temperature information of the MOSFET 1470 to impact the thermistor 1460.

Figure 15A:
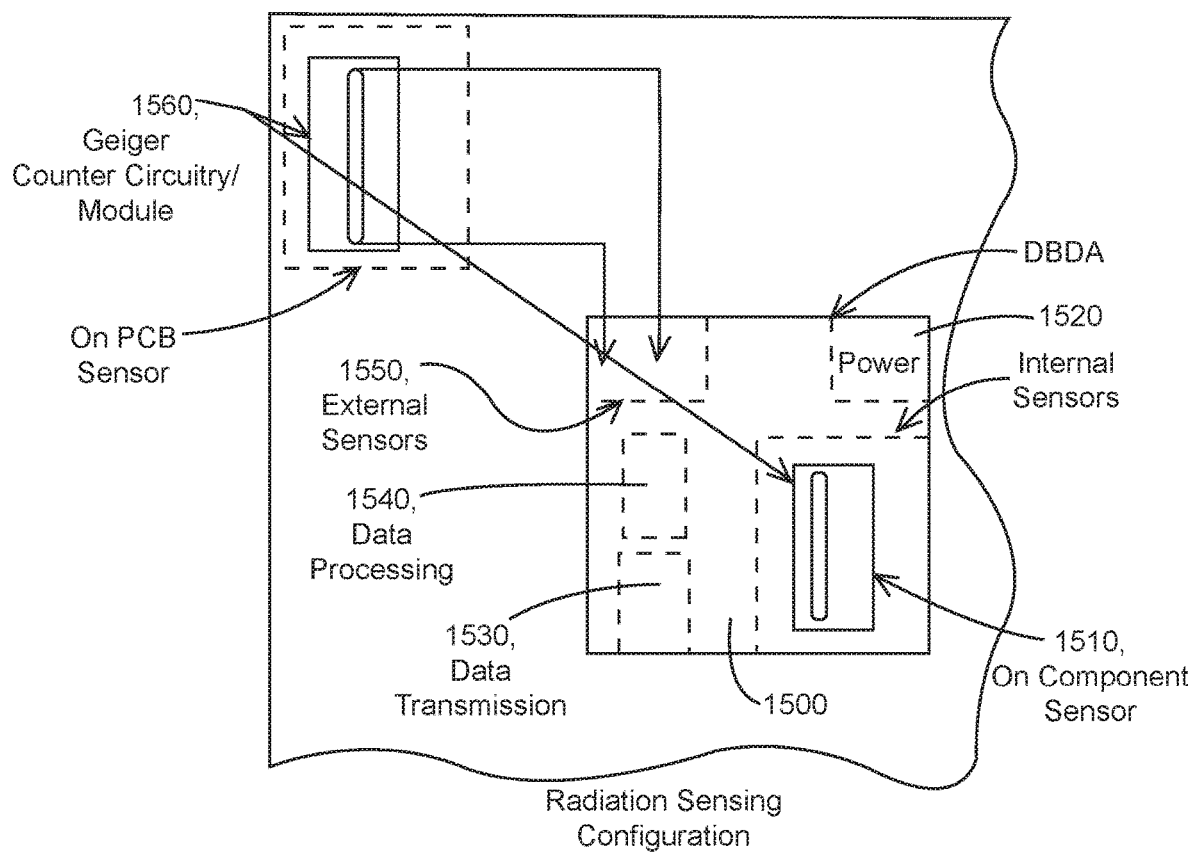
FIG. 15a shows a radiation sensing configuration.

FIG. 15a shows a radiation sensing configuration. A board 1500 is shown with an on component sensor 1510, a power section 1520, a data transmission section 1530, a data processing section 1540 an external sensors 1550. The external sensor 1560 may be a sensor that is on the board 1500. Accordingly, FIG. 15 is showing both alternatives, the on board and the on component sensor. It is understood that the on board sensor may be used solely, the on component sensor may be used solely or both sensors may be used in combination. The on component sensor 1510 and the on board sensor 1560 comprise a Geiger counter circuitry module. The sensor provides information to a detector (not shown) which may then provide information to an end use device (not shown).

Figure 15B:
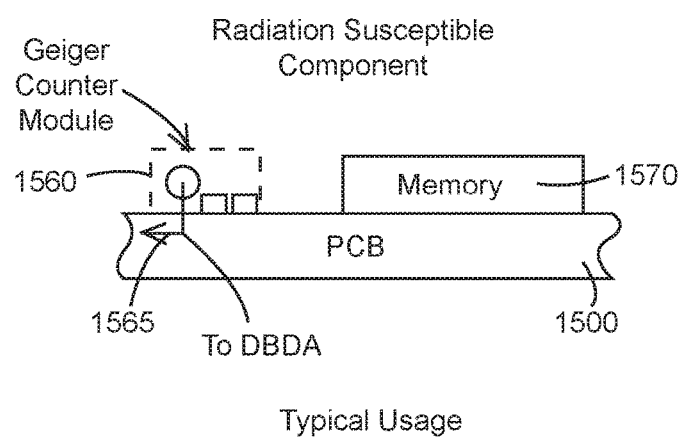
FIG. 15b shows typical usage of a radiation sensing configuration.

FIG. 15b shows typical usage of a radiation sensing configuration. A board 1500 is shown with a memory module 1570. The memory 1570 may be sensitive to certain levels of radiation. The Geiger counter module 1560 connects via a suitable connection 1565 to a detector (not shown) suitable for monitoring changes in radiation levels.

Figure 16A:
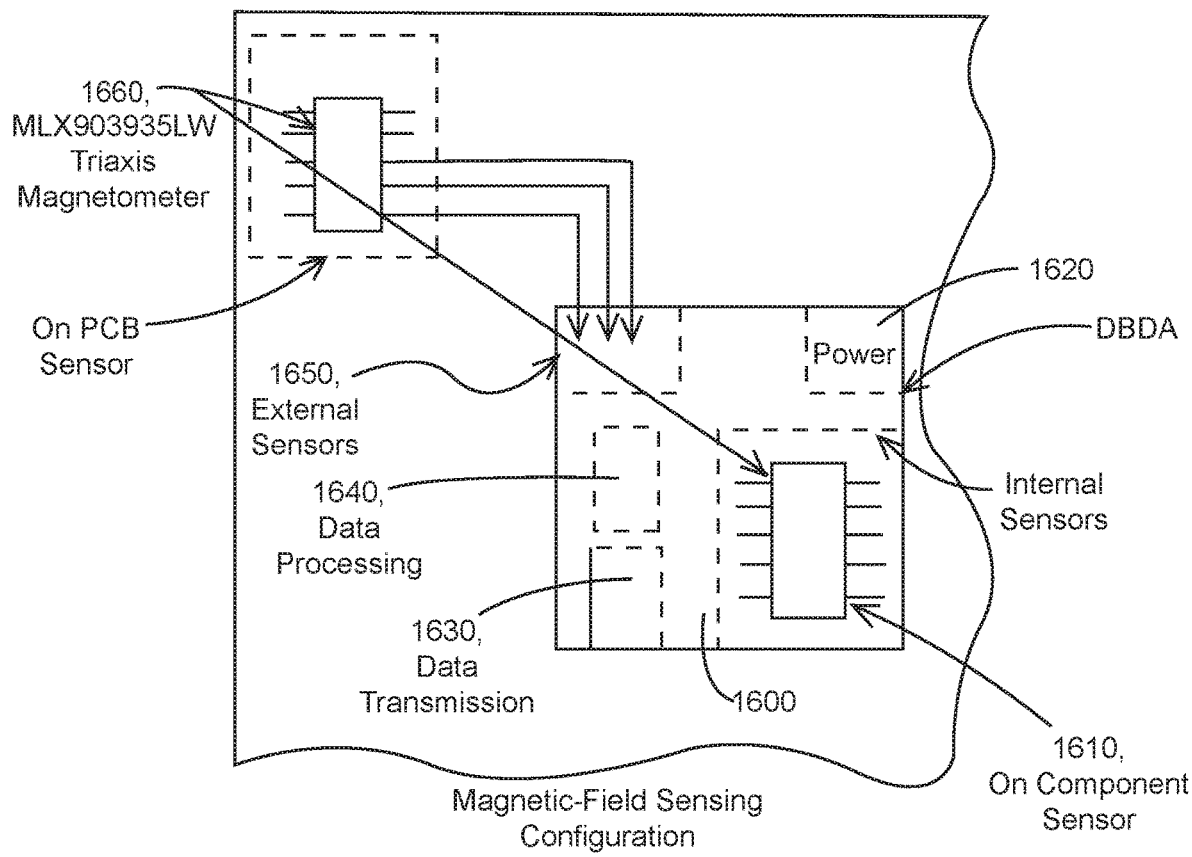
FIG. 16a shows a magnetic-field sensing configuration.

FIG. 16 a shows a magnetic-field sensing configuration. A board 1600 is shown with an on component sensor 1610, a power section 1620, a data transmission section 1630, a data processing section 1640 and external sensors 1650. The external sensor 1660 may be a sensor that is on the board 1600. Accordingly, FIG. 16 is showing both alternatives, the on board and the on component sensor. It is understood that the on board sensor may be used solely, the on component sensor may be used solely or both sensors may be used in combination. The on component sensor 1610 and the on board sensor 1660 comprise a magnetometer. The sensor provides information to a detector (not shown) which may then provide information to an end use device (not shown).

Figure 16B:
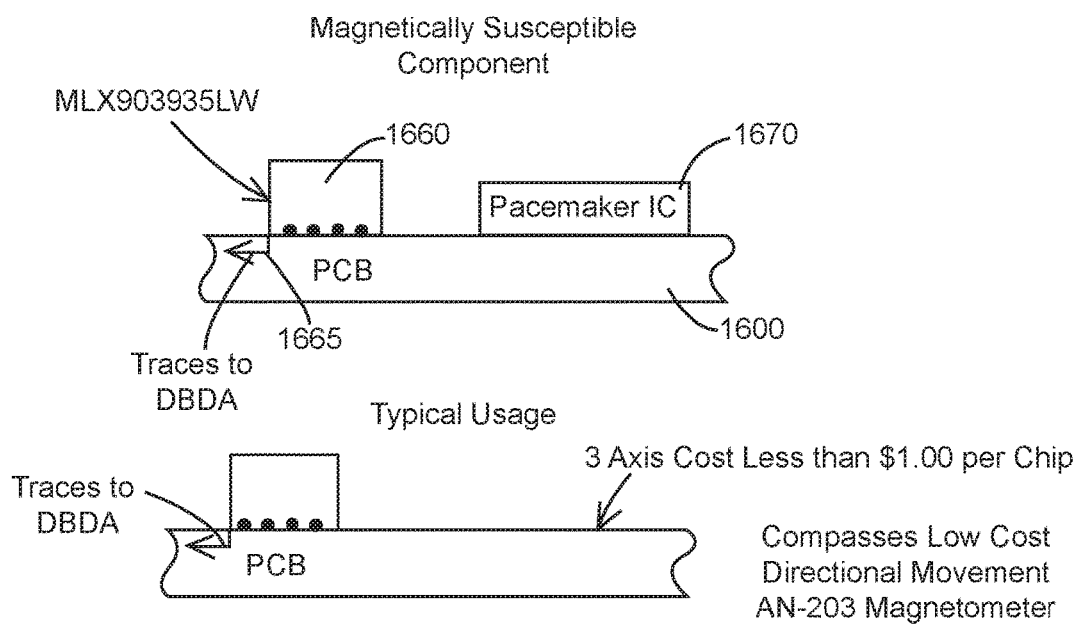
FIG. 16b shows a typical usage of a magnetic-field sensing configuration.

FIG. 16b shows a typical usage of a magnetic-field sensing configuration. A board 1600 is shown with a pacemaker integrated chip 1670. The pacemaker IC may be sensitive to magnetism. The magnetometer 1660 connects via a suitable connection 1665 to a detector (not shown) suitable for monitoring changes in radiation levels.

It is understood that combinations of sensor types and arrangements may be made on a single board or on a component. For instance, a thermistor may be used in combination with a complex capacitance/resistive sensor to provide information for multiple external influences. Where an environment has multiple facets, the sensors may be combined to account for multiple factors. Combinations of sensors allows changes in one characteristic to be correlated to possible changes in another characteristic of the environment.

The foregoing description of the invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for measuring electrochemical reliability of a functional electronic assembly, said system comprising:
   two or more electrodes integrated on said functional electronic assembly, wherein said two or more electrodes comprise a resistance sensing sensor, wherein at least one of said two or more electrodes is comprised of a graphene material, and wherein said functional electronic assembly is utilized in a field environment;
   a processor connected to said two or more electrodes, wherein said processor calculates resistance and monitors changes in said resistance as a function of surface contamination causing electrochemical reactions related to said contamination, wherein said resistance changes indicate a non-static migration of electrically charged species from a first of said two or more electrodes to a second of said two or more electrodes and wherein said changes to said resistance indicate said electrochemical reliability;
   an output signal generated by said processor, wherein said output signal indicates an actual surface insulation resistance whether said insulation resistance is within or not within a set limit.

2. The system of claim 1, wherein said processor comprises a current measurement device and wherein said current measurement device is one of contained within said processor and connected to said processor.

3. The system of claim 1, wherein said two or more electrodes comprise an electrochemical reliability measuring device.

4. The system of claim 1, wherein said impedance sensing sensor comprises one or more interdigitated electrodes.

5. The system of claim 1, wherein said processor comprises a voltage measurement device and wherein said voltage measurement device is one of contained within said processor and connected to said processor.

6. The system of claim 1, wherein said functional electronic assembly comprises a top side and an underside and wherein said two or more electrodes is located on one of said topside and said underside of said functional electronic assembly.

7. The system of claim 1, wherein said functional electronic assembly comprises a top side and an underside and wherein said two or more electrodes is located on said top side of said functional electronic assembly.

* * * * *